(12) United States Patent
Kang

(10) Patent No.: US 11,034,577 B2
(45) Date of Patent: Jun. 15, 2021

(54) INFRARED DETECTOR PIXEL STRUCTURE AND MANUFACTURING METHOD THEREOF

(71) Applicant: SHANGHAI IC R&D CENTER CO., LTD., Shanghai (CN)

(72) Inventor: Xiaoxu Kang, Shanghai (CN)

(73) Assignee: SHANGHAI IC R&D CENTER CO., LTD, Shanghai (CN)

(*) Notice: Subject to any disclaimer, the term of this patent is extended or adjusted under 35 U.S.C. 154(b) by 0 days.

(21) Appl. No.: 16/310,821

(22) PCT Filed: Sep. 8, 2016

(86) PCT No.: PCT/CN2016/098381
§ 371 (c)(1),
(2) Date: Dec. 18, 2018

(87) PCT Pub. No.: WO2018/018709
PCT Pub. Date: Feb. 1, 2018

(65) Prior Publication Data
US 2019/0177158 A1 Jun. 13, 2019

(30) Foreign Application Priority Data

Jul. 28, 2016 (CN) .......................... 201610602975.0
Jul. 28, 2016 (CN) .......................... 201610605232.9
Jul. 28, 2016 (CN) .......................... 201610605284.6

(51) Int. Cl.
*B81C 1/00* (2006.01)
*G01J 5/20* (2006.01)
(Continued)

(52) U.S. Cl.
CPC .............. *B81B 7/0009* (2013.01); *B81B 7/00* (2013.01); *B81C 1/00* (2013.01); *B81C 1/00063* (2013.01);
(Continued)

(58) Field of Classification Search
CPC .. B81B 7/0009; B81B 7/00; G01J 5/20; G01J 5/24; B81C 1/00; B81C 1/00063; B81C 2201/01; H01L 27/14685; H01L 27/14636
See application file for complete search history.

(56) References Cited

U.S. PATENT DOCUMENTS 6,080,988 A * 6/2000 Ishizuya ................... G01J 5/06
  250/330
6,448,557 B2 * 9/2002 Oda .......................... G01J 5/02
  250/330
(Continued)

*Primary Examiner* — Christine S. Kim
(74) *Attorney, Agent, or Firm* — Tianchen LLC.; Yuan R. Li; Yi Fan Yin

(57) ABSTRACT

The present invention provides an infrared detector pixel structure and manufacturing method thereof. The structure comprises a conductive metal region on surface of the silicon substrate; an infrared detecting element located above the silicon substrate for detecting infrared light and generating electrical signal; and a conductive beam unit electrically connected to the infrared detecting element for transmitting the electrical signal to the conductive metal region; the conductive beam unit includes at least one conductive beam layer and multilayer conductive trench arranged in a vertical direction; two ends of the conductive beam are respectively in contact with two layers of conductive trenches whose bottom portions are not in the same horizontal plane; the infrared detecting element is in contact with one conductive trench one conductive beam; the conductive metal region is in contact with bottom portion of the other layer of conductive trench therein; the electrical signal is transmitted along the height direction of the conductive trench and the conductive beam, so as to be transmitted downward to the conductive metal region in a circuitous path in the vertical direction.

20 Claims, 12 Drawing Sheets

(51) Int. Cl.
*G01J 5/24* (2006.01)
*B81B 7/00* (2006.01)

(52) U.S. Cl.
CPC . *G01J 5/20* (2013.01); *G01J 5/24* (2013.01); *B81C 2201/01* (2013.01)

(56) References Cited

U.S. PATENT DOCUMENTS

| | | | |
|---|---|---|---|
| 7,477,003 B2 * | 1/2009 | Takayanagi | B81B 3/0072 310/330 |
| 8,047,710 B2 * | 11/2011 | Ikushima | G01J 5/02 250/338.1 |
| 2008/0135758 A1 * | 6/2008 | Yang | G01J 5/20 250/338.1 |
| 2008/0265164 A1 * | 10/2008 | Ouvrier-Buffet | G01J 5/20 250/338.4 |
| 2009/0314941 A1 * | 12/2009 | Inomata | G01J 5/023 250/338.4 |
| 2016/0091371 A1 * | 3/2016 | Palanchoke | G01J 5/0853 250/349 |
| 2017/0241840 A1 * | 8/2017 | Pocas | G01J 5/024 |
| 2018/0331155 A1 * | 11/2018 | Leduc | H01L 27/16 |
| 2019/0088741 A1 * | 3/2019 | Jiang | H01L 29/0669 |

* cited by examiner

INFRARED DETECTOR PIXEL STRUCTURE AND MANUFACTURING METHOD THEREOF

CROSS-REFERENCE TO RELATED APPLICATION

The present application claims the priority benefit of International Patent Application Serial No. PCT/CN2016/098381, filed Sep. 8, 2016, which is related to and claims priorities to Chinese Patent Application No. 201610605284.6, filed with the Chinese Patent Office on Jul. 28, 2016 and entitled as "PIXEL STRUCTURE OF HIGHLY FILLING INFRARED DETECTOR AND MANUFACTURING METHOD THEREOF", Chinese Patent Application No. 201610605232.9, filed with the Chinese Patent Office on Jul. 28, 2016 and entitled as "PIXEL STRUCTURE OF THREE DIMENSION INFRARED DETECTOR AND MANUFACTURING METHOD THEREOF" and Chinese Patent Application No. 201610602975.0, filed with the Chinese Patent Office on Jul. 28, 2016 and entitled as "PIXEL STRUCTURE OF SUSPENSION TYPE INFRARED DETECTOR AND MANUFACTURING METHOD THEREOF", which are incorporated in the present application by reference in its entirety.

FIELD OF THE INVENTION

The present invention relates to a field of semiconductor technology, and more particular, to an infrared detector pixel structure and a manufacturing method thereof.

BACKGROUND OF THE INVENTION

The infrared detector is a device that converts incident infrared radiation signal into electrical signal to output. The infrared detector detects presence or movement of an object by using an infrared sensor and collects and gathers the external infrared radiation to the infrared sensor. The infrared sensor adopts a thermal element, which will output the signal when accepting a change in temperature of the infrared radiation, convert the signal into an electrical signal, and then perform waveform analysis on the electrical signal. In the conventional infrared detector pixel structure, only one type of thermistor which is usually amorphous silicon or vanadium oxide with a negative temperature coefficient is used, and the signal of the change thereof is amplified and output by a circuit.

However, for an infrared detector structure using a thermal element, the sensitivity is generally not very high, the infrared detector structure is relatively complicated, and the detection process is complicated. If a thermal element with higher sensitivity is used, the material cost is expensive.

Therefore, there is an urgent need to improve the existing infrared detector to enhance sensitivity and reduce structural complexity and cost.

BRIEF SUMMARY OF THE DISCLOSURE

In order to overcome the above problems, the present invention is directed to provide an infrared detector pixel structure and a manufacturing method thereof.

In order to achieve the above objects, the present invention provides an infrared detector pixel structure, which is located on a silicon substrate, comprising a conductive metal region on surface of the silicon substrate; an infrared detecting element located above the silicon substrate for detecting infrared light and generating electrical signal; and a conductive beam unit electrically connected to the infrared detecting element for transmitting the electrical signal generated by the infrared detecting element to the conductive metal region; wherein the conductive beam unit includes at least one conductive beam layer and multilayer conductive trenches arranged in a vertical direction; wherein the two ends of each layer of the conductive beam are respectively connected to two layers of the multilayer conductive trenches whose bottom portions are not in the same horizontal plane; the infrared detecting element is in contact with one layer of the multilayer conductive trenches therein or one layer of the conductive beam unit therein; the conductive metal region is in contact with the bottom portion of the other layer of the multilayer conductive trenches therein; the electrical signal generated by the infrared detecting element is transmitted along the height direction of the conductive trench and the horizontal direction of the conductive beam unit, to be transmitted downward to the conductive metal region in a circuitous path in the vertical direction.

Preferably, the topmost layer of the conductive beam unit comprises a top layer conductive beam; the multilayer conductive trenches includes first conductive trench of which bottom portion is in contact with the conductive metal region and top portion is located at the topmost layer of the conductive beam unit and second conductive trench of which bottom portion is higher than that of the first conductive trench and top portion is located at the topmost layer of the conductive beam unit; the top portion of the first conductive trench and the top portion of the second conductive trench are respectively connected to two ends of the top layer conductive beam; the bottom portion of the second conductive trench is connected to the infrared detecting element; the electrical signal generated by the infrared detecting element is firstly transmitted to the top portion of the second conductive trench via the bottom portion of the second conductive trench, next transmitted to the top portion of the first conductive trench via the top layer conductive beam, then transmitted to the bottom portion of the first conductive trench from the top portion of the first conductive trench and thus transmitted to the conductive metal region; and further transmitted to an interconnection layer via the conductive metal region.

Preferably, the bottom portion of every layer conductive trench and the top portion of a conductive trench which is an adjacent layer below the layer conductive trench are respectively connected to two ends of one layer of the conductive beam unit therein; wherein the bottom portion of one layer of conductive trench is in contact with the conductive metal region; the topmost layer of the conductive beam unit comprises a top layer conductive trench and a top layer conductive beam; the top layer conductive beam is connected to the infrared detecting element such that a microbridge structure is located above the conductive beam unit, and the conductive trench and the conductive beam at each layer constitute a structure with a circuitous stepwise shape such that a transmission path of electrical signal generated by the micro-bridge structure is a circuitous stepwise shape; the electrical signal generated by the infrared detecting element is transmitted from the top layer conductive beam to the top portion of the top layer conductive trench, then transmitted to the bottom portion of the top layer conductive trench, and finally transmitted to the conductive metal region by transmission between the multilayer conductive trenches and the conductive beam or the multilayer conductive trenches and the conductive beams.

Preferably, the conductive beam is constituted by a conductive layer and an upper release protection layer and a lower release protection layer surrounding the conductive layer; the conductive trench is constituted by an upper release protection layer, a lower release protection layer, and a conductive layer between the upper release protection layer and the lower release protection layer.

Preferably, the conductive beam is constituted by a conductive layer and a release protection layer on the upper surface of the conductive layer; the conductive trench is constituted by a conductive layer and an upper release protection layer on the conductive layer.

Preferably, the conductive beam is constituted by a conductive layer; the conductive trench is constituted by a conductive layer.

Preferably, the conductive trench is fully filled with the conductive layer.

Preferably, the bottom portion of the conductive beam has protrusions.

Preferably, the protrusions are located at non-center positions of the conductive beam.

Preferably, the protrusions are located at equipartitions of the conductive beam.

Preferably, the protrusions and the conductive beam both are groove.

Preferably, the protrusions are reverse hemisphere or reverse cone.

Preferably, the surface of the silicon substrate further has a reflective region which is located below the infrared detecting element, and there is a dielectric layer between the reflective region and the conductive metal region; an interconnection layer is connected to an external circuit.

In order to achieve the above objects, the present invention provides a method of manufacturing the above infrared detector pixel structure, comprising of:

Step 01: providing a silicon substrate and forming a conductive metal region on the surface of the silicon substrate;

Step 02: forming the conductive beam unit at first and then forming the infrared detecting element above the silicon substrate, or forming the infrared detecting element at first and then forming the conductive beam unit above the silicon substrate, wherein the infrared detecting element is in contact with one layer of the conductive beam unit or the conductive trench in the conductive beam unit, and bottom portion of another layer of the conductive trench in the conductive beam unit is in contact with the conductive metal region.

Preferably, the topmost layer of the conductive beam unit has only the top layer conductive trench; the Step 02 specifically comprises of: forming one layer of sacrificial layer on the silicon substrate; etching out a pattern of the conductive trench and/or a pattern of the conductive beam in the sacrificial layer, and forming a conductive layer in the pattern of the conductive trench and/or the pattern of the conductive beam to form the conductive trench and/or the conductive beam; repeating the above process so as to complete the manufacture of the conductive beam unit; wherein after a sacrificial layer at the topmost layer is formed, the pattern of the top layer conductive trench is etched out in the sacrificial layer at the topmost layer and the conductive layer is formed in the pattern of the top layer conductive trench to form the top layer conductive trench, so as to complete the manufacture of the conductive beam unit; then forming the infrared detecting element on the sacrificial layer at the topmost layer and the top layer conductive trench such that the infrared detecting element is in contact with the top layer conductive trench; finally, releasing all the sacrificial layers by a release process.

Preferably, the topmost layer of the conductive beam unit includes the top layer conductive trench and the top layer conductive beam; the step 02 specifically comprises of: forming one layer of sacrificial layer on the silicon substrate; etching out a pattern of the conductive trench and/or a pattern of the conductive beam in the sacrificial layer, and forming a conductive layer in the pattern of the conductive trench and/or the pattern of the conductive beam to form the conductive trench or the conductive beam of the layer; repeating the above process, wherein after a topmost sacrificial layer is formed, the pattern of the top layer conductive trench and the pattern of the top layer conductive beam are etched out in the topmost sacrificial layer and the conductive layer is formed in the pattern of the top layer conductive trench and the pattern of the top layer conductive beam so as to form the top layer conductive trench and the top layer conductive beam, and thus to complete the manufacture of the conductive beam unit; then forming the infrared detecting element on the topmost sacrificial layer and the top layer conductive beam unit such that one end of the top layer conductive beam is in contact with the infrared detecting element; finally, releasing all the sacrificial layers by a release process.

Preferably, the topmost layer of the conductive beam unit is a top layer conductive beam; the multilayer conductive trenches includes a first conductive trench of which bottom portion is in contact with the conductive metal region and the top portion is located at the topmost layer of the conductive beam unit and a second conductive trench of which bottom portion is higher than that of the first conductive trench and top portion is located at the topmost layer of the conductive beam unit; the Step 02 specifically comprises of: firstly forming first sacrificial layer on the silicon substrate; etching out a pattern of the lower portion of the first conductive trench in the first sacrificial layer, and forming a conductive layer in the pattern of the lower portion of the first conductive trench so as to form the lower portion of the first conductive trench; then forming the infrared detecting element on the first sacrificial layer, the infrared detecting element being not in contact with the lower portion of the first conductive trench; secondly forming second sacrificial layer on the silicon substrate which has been subjected to the Step 03, etching out a pattern of the second conductive trench, a pattern of the top layer conductive beam and a pattern of the remaining upper portion of the first conductive trench in the second sacrificial layer, and forming a conductive layer in the pattern of the second conductive trench, the pattern of the top layer conductive beam and the pattern of the remaining upper portion of the first conductive trench so as to form the complete first conductive trench, the second conductive trench and the top layer conductive beam; finally releasing all the sacrificial layers by a release process.

Preferably, in the Step 02, the process of forming the conductive layer specifically comprises of: sequentially forming a lower release protection layer, a conductive layer and an upper release protection layer in the pattern of the conductive trench and/or the pattern of the conductive beam; or sequentially forming a conductive layer and a release protection layer in the pattern of the conductive trench and/or the pattern of the conductive beam; or only forming a conductive layer in the pattern of the conductive trench and/or the pattern of the conductive beam.

Preferably, when only the conductive layer is deposited in the pattern of the conductive trench, the pattern of the conductive trench is fully filled with the conductive layer, or there are gaps between the conductive layers at sidewalls of the conductive trench.

The infrared detector pixel structure and manufacturing method thereof realize the step transmission of the electrical signal in the longitudinal direction by setting the conductive beam unit constituted by the conductive trenches and the conductive beams which are distributed in multilayer in the longitudinal direction, thereby reducing the lateral occupied area of the device and increasing the integration density of the pixel structure, that is, increasing fill factor of the pixel structure. In addition, the micro-bridge structure can be set on the conductive beam unit or can also be suspended in the conductive beam unit. Apparently, setting position of the micro-bridge structure becomes more flexible, such that occupancy rate of the horizontal area of the micro-bridge structure is improved, which not only reduces the horizontal area of a single pixel, improves the integration degree of a single silicon wafer, but also improves detection sensitivity and signal-to-noise ratio by improving occupancy rate of the horizontal area of the micro-bridge structure, and thus improve the performance of the entire infrared detector.

DETAILED DESCRIPTION OF THE EMBODIMENTS

Figure 1A:
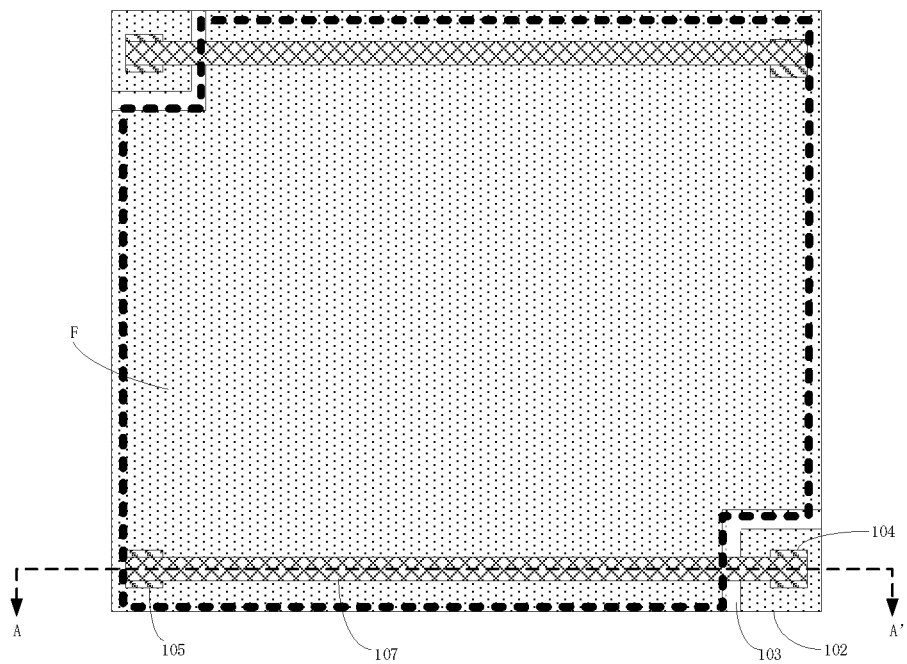
FIG. 1a is a top structural schematic diagram of an infrared detector pixel structure according to Embodiment 1 of the present invention

In order to make the content of the present invention clearer and easier to understand, the contents of the present invention will be further described below in combination with the drawings. Certainly, the present invention is not limited to the specific embodiment, and general replacements well known to those skilled in the art are also encompassed within the protection scope of the present invention.

In the present invention, the infrared detector pixel structure is located on a silicon substrate, and comprises: a conductive metal region on surface of the silicon substrate, an infrared detecting element located above the silicon substrate for detecting infrared light and generating electrical signal, and a conductive beam unit which is electrically connected to the infrared detecting element, for transmitting the electrical signal generated by the infrared detecting element to the conductive metal region; the conductive beam unit includes at least one layer conductive beam and multilayer conductive trenches arranged in a vertical direction; wherein, two ends of each conductive beam are respectively connected to two layers of the multilayer conductive trenches whose bottom portions are not in the same horizontal plane; the infrared detecting element is in contact with one layer of the conductive trench therein or one layer of conductive beam unit therein; the conductive metal region is in contact with bottom portion of the other layer of conductive trench therein; the electrical signal generated by the infrared detecting element is transmitted along the height direction of the conductive trench and the horizontal direction of the conductive beam unit, so as to be transmitted downward to the conductive metal region in a circuitous path in the vertical direction;

There are cavities below the infrared detecting element, between the conductive beams and below the conductive beams; ; a reflection region at bottom portion of the cavity formed below the infrared detecting element reflects infrared light which is not absorbed by the infrared detecting element onto the infrared detecting element, and the detection on the infrared light by the infrared detecting element may be completed by multiple reflections; the cavity constitutes a resonant cavity of the infrared detector pixel structure.

In one embodiment of the present invention, the topmost layer of the conductive beam unit has a top layer conductive beam; the multilayer conductive trenches includes first conductive trench of which bottom portion is in contact with the conductive metal region and top portion is located at the topmost layer of the conductive beam unit and second conductive trench of which bottom portion is higher than that of the first conductive trench and top portion is located at the topmost layer of the conductive beam unit; the top portion of the first conductive trench and the top portion of the second conductive trench are respectively connected to two ends of the top layer conductive beam; the bottom portion of the second conductive trench is connected to the infrared detecting element; the electrical signal generated by the infrared detecting element is firstly transmitted to the top portion of the second conductive trench via the bottom portion of the second conductive trench, next transmitted to the top portion of the first conductive trench via the top layer conductive beam, then transmitted to the bottom portion of the first conductive trench from the top portion of the first conductive trench and thus transmitted to the conductive metal region.

In another embodiment of the present invention, the bottom portion of every layer conductive trench and top portion of a conductive trench which an adjacent layer below the layer conductive trench is are connected to the same conductive beam and are respectively connected to two ends of the conductive beam; the topmost layer of the conductive beam unit has only the top layer conductive trench. The top portion of the top layer conductive trench is connected to the infrared detecting element such that the infrared detecting element is located above the conductive beam unit, and the conductive trench and the conductive beam at each layer constitute a structure with a circuitous stepwise shape such that a transmission path of the electrical signal generated by the infrared detecting element is a circuitous stepwise shape; the electrical signal generated by the infrared detecting element is transmitted from the top portion of the top layer conductive trench to the bottom portion of the top layer conductive trench, then transmitted to the top portion of the next layer conductive trench via the conductive beam, and finally transmitted to the conductive metal region by transmission between the multilayer conductive trenches and the conductive beam.

In another embodiment of the present invention, bottom portion of each layer of the multilayer conductive trenches and the top portion of a conductive trench which is an adjacent layer below the layer conductive trench are respectively connected to two ends of one layer of the conductive beam unit; the top layer conductive trench and the top layer conductive beam are located in the topmost layer of the conductive beam unit; the top layer conductive beam unit is connected to the infrared detecting element such that the infrared detecting element is located above the conductive beam unit, and the conductive trench and the conductive beam unit at each layer constitute a structure with a circuitous stepwise shape such that a transmission path of electrical signal generated by the infrared detecting element is a circuitous stepwise shape; the electrical signal generated by the infrared detecting element is transmitted from the top layer conductive beam to the top portion of the top layer conductive trench, then transmitted to the bottom portion of the top layer conductive trench, and finally transmitted to the conductive metal region by transmission between the multilayer conductive trench and the conductive beam.

Figure 22A:
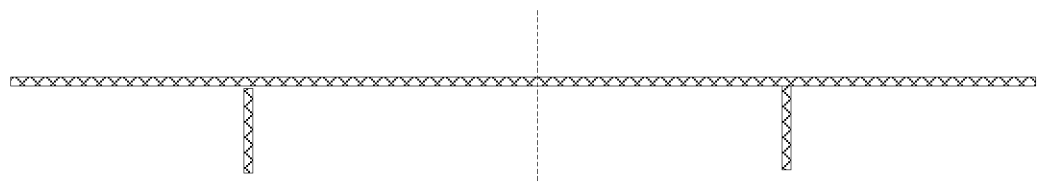
FIG. 22a is a schematic diagram of a bottom portion structure of a solid conductive beam according to a preferred embodiment of the present invention
Figure 22B:
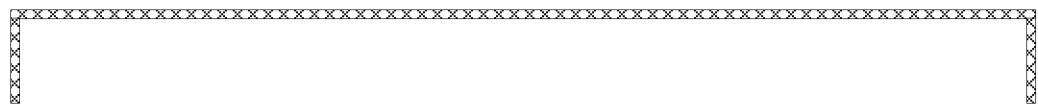
FIG. 22b is a schematic diagram of a bottom portion structure of a solid conductive beam according to a preferred embodiment of the present invention
Figure 22C:
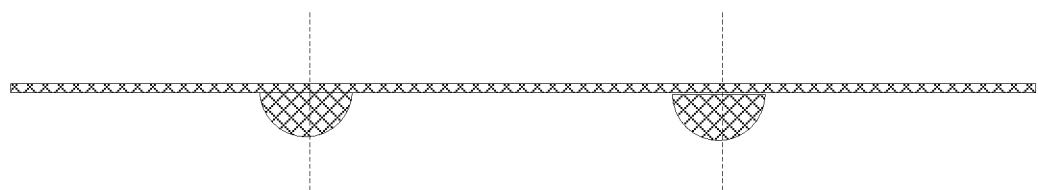
FIG. 22c is a schematic diagram of a bottom portion structure of a solid conductive beam according to a preferred embodiment of the present invention
Figure 22D:
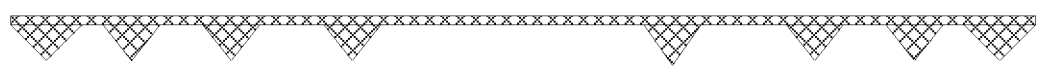
FIG. 22d is a schematic diagram of a bottom portion structure of a solid conductive beam according to a preferred embodiment of the present invention

In a preferred embodiment of the present invention, the bottom portion of each conductive beam in the conductive beam unit has a plurality of protrusions, as shown in FIGS. 22a-22d; the bottom portion at non-center region of the conductive beam in a preferred embodiment shown in FIG. 22a has long striped protrusions in the vertical direction, and the bottom portion at two ends of the conductive beam in a preferred embodiment shown in FIG. 22b has long striped protrusions in the vertical direction; the setting of such protrusions is also particularly suitable to the top layer conductive beam of the first embodiment described below of the present invention, and it is possible to avoid excessive bending of two ends of the conductive beam by setting protrusions at the bottom portion of two ends of the conductive beam unit. In addition, the thickness of the long-striped protrusions is the same as that of the conductive beam, and the length of the protrusions is not greater than half of the length of the conductive beam. In other embodiments of the present invention, the plurality of protrusions may also be located at bottom portion of any part of the conductive beam. The shape of the protrusions may also be a reverse hemisphere as shown in FIG. 22c, a reverse cone as shown in FIG. 22d, and so on. The distribution of the protrusions may be arranged in an equal interval array, such as a rectangular array, or may be located at equipartitions of the conductive beam unit, for example, as shown in FIG. 22a, the dotted line is position at which the center is located, the protrusions are located at the quarter of the conductive beam and is not at the center, and as shown in FIG. 22c, the protrusions are located at the trisection of the conductive beam; the setting of these protrusions are used to enhance the strength of the conductive beam, and avoid deformation and performance failure of the whole device due to excessive bending of the conductive beam when it is set suspended; meanwhile, the bending strength of the conductive beam can be enhanced, and in the case of vibration, the conductive beam can be effectively supported so as to make it less prone to breakage due to sudden deformation; preferably, the protrusions are not set at the center of the conductive beam; and the density of the distribution of these protrusions may gradually decreased from two ends to the center of the conductive beam, i.e. the interval between the protrusions is gradually increased from two ends to the center of the conductive beam so as to act as effective support and protection for the center of the suspended conductive beam.

It should also be noted that, in a preferred embodiment of the present invention, since each layer of the conductive metal layer and/or the upper release protection layer and/or the lower release protection layer is simultaneously deposited in a pattern of the conductive trench, a pattern of the conductive beam and protrusion pattern of the bottom portion of the conductive beam, these patterns may be fully filled to form a solid, and also may not be fully filled to form a groove, the structure of the combination of the conductive beam and the protrusions at the bottom portion thereof with the conductive trench includes any combination of a solid or groove conductive beam, solid or groove protrusions at the bottom portion of the conductive beam and a solid or groove conductive trench, which are all within the scope of the present invention.

It should be noted that the infrared detector pixel structure of the present invention may be either a front-illuminated type or a back-illuminated type. In the conductive beam of the present invention, one layer of conductive trenches and one layer of conductive beam which is in contact with the top portion of the layer conductive trench constitute one layer unit; if there is no conductive beam unit at the top portion of certain one layer of conductive trenches, the layer conductive trench is regarded as a single layer unit; if there are conductive trenches whose lengths are inconsistent in the vertical direction, a layer at which the shorter one of the conductive trenches is located is regarded as one layer unit, and the longer conductive trench spans two or more layers.

In addition, in the present invention, the method for manufacturing the above infrared detector pixel structure may comprise of:

providing a silicon substrate and forming a conductive metal region on surface of the silicon substrate;

forming the conductive beam unit at first and then forming the infrared detecting element above the silicon substrate, or forming the infrared detecting element at first and then forming the conductive beam unit above the silicon substrate, wherein the infrared detecting element is in contact with one layer of the conductive beam or the conductive trench in the conductive beam unit, and the bottom portion of another layer of conductive trenches of the conductive beam unit is in contact with the conductive metal region.

It should be noted that, in the following Embodiment 1, Embodiment 2 and Embodiment 3, the surface of the silicon substrate further has a reflective region, the reflective region is located below the infrared detecting element, and there is a dielectric layer between the reflective region and the conductive metal region; an interconnection layer is connected to an external circuit. The infrared detecting element adopts a micro-bridge structure. The conductive layer adopts a conductive metal layer.

Embodiment 1

Hereinafter, the present invention will be described in detail with reference to FIGS. 1a-8c and specific embodiments. It should be noted that the drawings are made by adopting a very simplified form and using a non-precise ratio, and the purpose thereof is to auxiliary explain the present embodiment in an easy and clear way.

It should be noted that, in the present embodiment, the surface of the silicon substrate further has a reflective region, the reflective region is located below the infrared detecting element, and there is a dielectric layer between the reflective region and the conductive metal region; an interconnection layer is connected to an external circuit. The infrared detecting element adopts a micro-bridge structure. The conductive layer adopts a conductive metal layer.

Figure 1B:
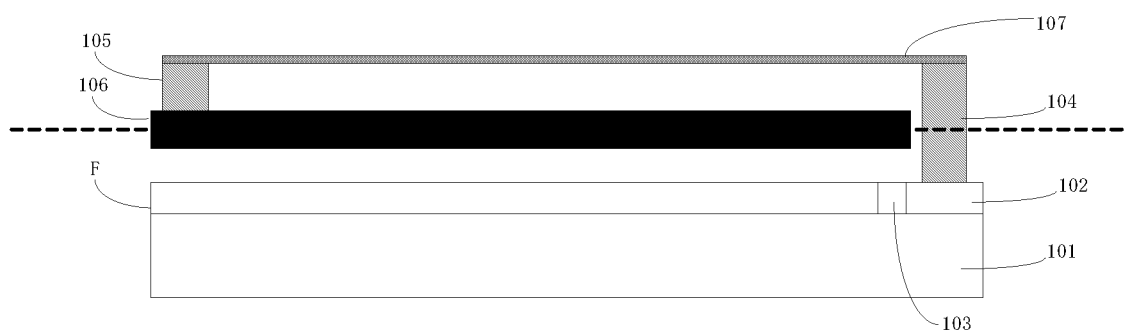
FIG. 1b is a side structural schematic diagram of an infrared detector pixel structure according to Embodiment 1 of the present invention
Figure 1C:
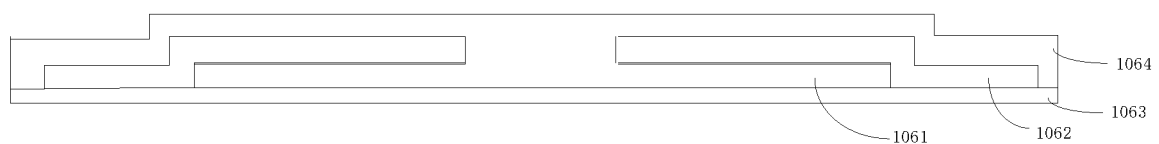
FIG. 1c is a cross-sectional structural schematic diagram of a micro-bridge structure according to Embodiment 1 of the present invention

In the present embodiment, referring to FIG. 1a and FIG. 1b, FIG. 1b is a schematic diagram of the cross-sectional structure along AA' in FIG. 1a. In FIG. 1a, the micro-bridge structure is removed for convenience of representation, and the region occupied by the micro-bridge structure is indicated by a thick dotted line frame. The infrared detector pixel structure is located on a silicon substrate 101 in which there is an interconnection layer (not shown), and the surface of the silicon substrate 101 has a conductive metal region 102 electrically connected to the interconnection layer, a reflective region F and a dielectric region 103 between the conductive metal region 102 and the reflective region F; the interconnection layer is connected to an external circuit; it should be noted that the interconnection layer in the present embodiment may be replaced with other conductive structures which can be connected to the conductive metal region and the external circuit. The pixel structure of the present embodiment further includes:

A micro-bridge structure 106 which is located above the reflective region F for detecting infrared light and generating electrical signal. Referring to FIG. 1c, the micro-bridge structure may include a lower release protection layer 1063, an infrared sensitive material layer 1061, an electrode layer 1062 and an upper release protection layer 1064. The electrode layer 1062 is connected to the conductive beam 107 of the conductive beam unit to ensure that electrical signal generated by the micro-bridge structure 106 are transmitted to the conductive metal region 102 via the conductive beam unit to be further transmitted to the interconnection layer and the external circuit.

The conductive beam unit which is electrically connected to the micro-bridge structure 106. The conductive beam unit includes first conductive trench 104 and second conductive trench 105 whose bottom portions are not in the same layer. In this embodiment, the conductive trench can be divided into two layers, as shown in FIG. 1b, the first layer is below the dotted line, and the second layer is above the dotted line; the first conductive trench 104 penetrates through the first layer and the second layer, and the second conductive trench 105 is located at the second layer. It should be noted that in the present invention, the first conductive trench 104 is not limited to only penetrate through two layers, and the bottom portion of the second conductive trench 105 is not limited to be located only at the second layer; herein, the length of the first conductive trench 104 in the vertical direction is greater than the length of second conductive trench 105 in the vertical direction, and the top portion of the first conductive trench 104 is aligned with the top portion of the second conductive trench 105. In this embodiment, a top layer conductive beam 107 is also included, and the top portion of the first conductive trench 104 is in contact with one end of the top layer conductive beam 107; the top portion of the second conductive trench 105 is in contact with the other end of the top layer conductive beam 107, and the bottom portion of the second conductive trench 105 is in contact with the micro-bridge structure 106, such that the micro-bridge structure 106 is suspended between the conductive beams. The electrical signal generated by the micro-bridge structure 106 is firstly transmitted to the top portion of the second conductive trench 105 via the bottom portion of the second conductive trench 105, next transmitted to the top portion of the first conductive trench 104 via the top layer conductive beam 107, then transmitted from the top portion of the first conductive trench 104 to the bottom portion of the first conductive trench 104 and thus to the conductive metal region 102. Wherein the second conductive trench 105 is located above the reflective region F, and the first conductive trench 104 is located on the metal conductive region 102.

It is empty below the micro-bridge structure 106 and between the top layer conductive beam 107 and the micro-bridge structure 106.

It should be noted that, as shown in FIGS. 1a and 1b, the micro-bridge structure 106 is suspended in the conductive beam unit, two sides of the silicon substrate 101 respectively have two conductive beams, and the two conductive beams are respectively in contact with and connected to two diagonal corners of the micro-bridge structure 106.

Therefore, the present embodiment achieves a stepwise transmission of the electrical signal in the longitudinal direction, reduces the lateral occupied area of the device and increases the integration density of the pixel structure, that is, increases fill factor of the pixel structure.

Figure 8A:
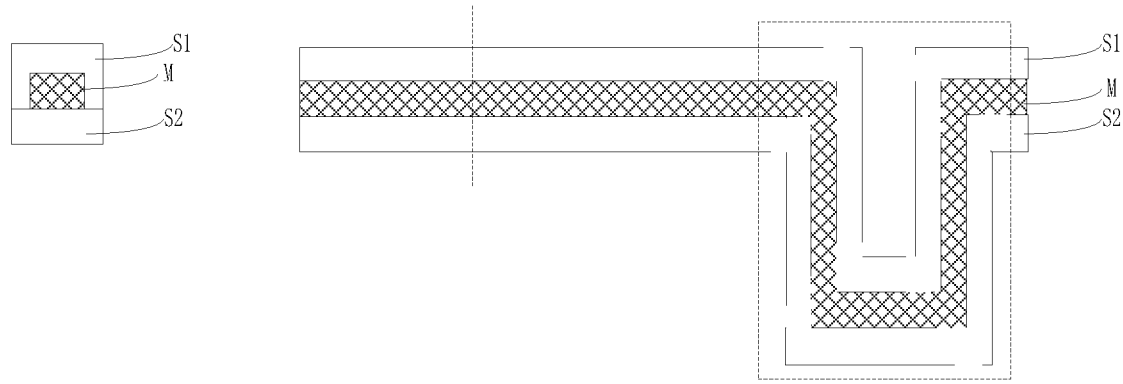
FIG. 8a is a structural schematic diagram of a conductive trench and a conductive beam according to a preferred embodiment of the present invention

Referring to FIG. 8a, the structure inside the dotted line frame indicates the first conductive trench or the second conductive trench, and the structure outside the dotted line frame indicates the conductive beam. The conductive beam may be constituted by a conductive metal layer M and an upper release protection layer S1 and a lower release protection layer S2 which surround the conductive metal layer M; correspondingly, both of the first conductive trench and the second conductive trench may be constituted by the upper release protection layer S1, the lower release protection layer S2 and the conductive metal layer M between the upper release protection layer S1 and the lower release protection layer S2.

Figure 8B:
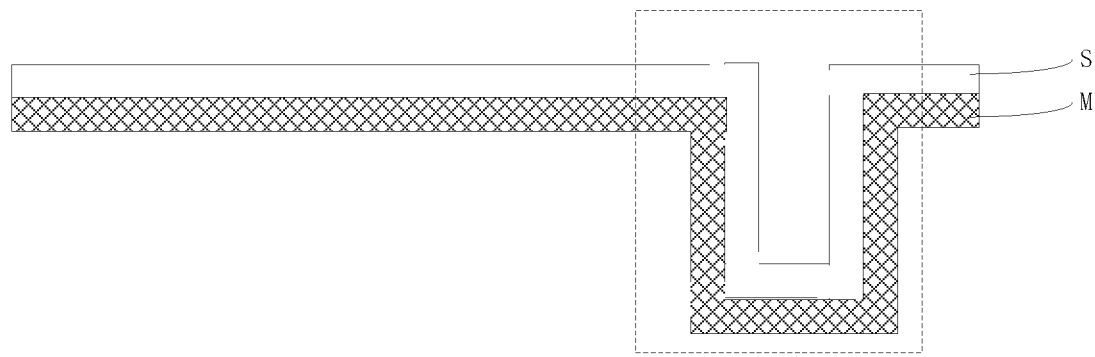
FIG. 8b is a structural schematic diagram of a conductive trench and a conductive beam according to a preferred embodiment of the present invention

Referring to FIG. 8b, the structure inside the dotted line frame indicates the first conductive trench or the second conductive trench, and the structure outside the dotted line frame indicates the conductive beam. The conductive beam may be constituted by a conductive metal layer M and a release protection layer S which is located on the upper surface of the conductive metal layer M; correspondingly, the first conductive trench and the second conductive trench both are constituted by the conductive metal layer M and the release protection layer S which is located on the conductive metal layer M.

Figure 8C:
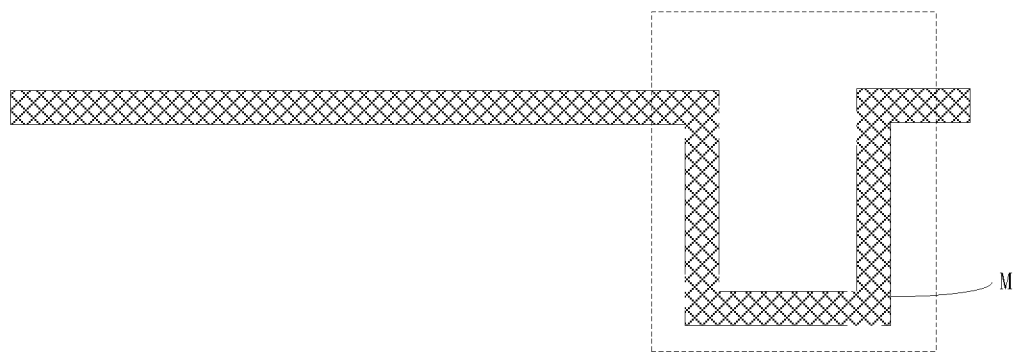
FIG. 8c is a structural schematic diagram of a conductive trench and a conductive beam according to a preferred embodiment of the present invention

Referring to FIG. 8c, in FIG. 8c, the structure inside the dotted line frame at right indicates the first conductive trench or the second conductive trench, and the structure outside the dotted line frame indicates the conductive beam; the cross-sectional view of the dotted line direction is shown as left of FIG. 8c, and the conductive beam may be constituted by a conductive metal layer M; correspondingly, the first conductive trench and the second conductive trench are constituted by the conductive metal layer M.

In the present embodiment, the bottom portion of the top layer conductive beam 107 in the conductive beam unit has protrusions, as shown in FIGS. 22a-22, the bottom portion of the non-central region of the conductive beam of a preferred embodiment shown in FIG. 22a has long striped protrusions in the vertical direction, and the bottom portion of two ends of the conductive beam of a preferred embodiment shown in FIG. 22b has long striped protrusions in the vertical direction; the setting of such protrusions is particularly suitable to a case where the bottom portion of the conductive beam is not supported by anything, and it is possible to avoid excessive bending at two ends of the conductive beams by setting the protrusions at the bottom portion of two ends of the conductive beams. In addition, the thickness of the long striped protrusions is the same as that of the conductive beam, and the length of the protrusions is not greater than half of the length of the conductive beam; in other embodiments of the present invention, a plurality of protrusions may also be located at bottom portion of any part of the conductive beam, and the shape of the protrusions may also be a reverse hemisphere as shown in FIG. 22c, a reverse cone as shown in FIG. 22d and so on; the distribution of these protrusions may be arranged in an equal interval array such as a rectangular array, or may be located at equipartitions of the conductive beam, for example, as shown in FIG. 22a, the dotted line is position at which the center is located, the protrusions are located at the quarters of the conductive beam and is not at the center, and as shown in FIG. 22c, the protrusions are located at the trisections of the conductive beam; the setting of these protrusions is used to enhance the strength of the conductive beam, and avoid deformation and performance failure of the whole device due to excessive bending of the conductive beam when it is set suspended; meanwhile, the bending strength of the conductive beam can be enhanced, and in the case of vibration, the conductive beam can be effectively supported so as to make it less prone to breakage due to sudden deformation; preferably, the protrusions are not set at the center of the conductive beam; and the density of the distribution of these protrusions may gradually decreased from two ends to the center of the conductive beam, i.e. the interval between the protrusions is gradually increased from two ends to the center of the conductive beams so as to act as effective support and protection for the center of the suspended conductive beam.

In a pattern of the second conductive trench, a pattern of the protrusion, a pattern of the top layer conductive beam and a pattern of the upper portion of the first conductive trench, a lower release protection layer, a conductive metal layer and an upper release protection layer are sequentially formed, or a conductive metal layer and an upper release protection layer are formed, or only a conductive metal layer is formed, and there is gap between the conductive metal layers located on the sidewall of the first conductive trench, and there is gap between the conductive metal layers located on the sidewall of the second conductive trench; or the conductive metal layer fully fills the pattern of the second conductive trench and the pattern of remaining upper portion of the first conductive trench, and the first conductive trench and the second conductive trench are a shape of a conductive pillar.

Figure 23A:
FIG. 23a is a schematic diagram of a bottom portion structure of a groove conductive beam according to a preferred embodiment of the present invention
Figure 23B:
FIG. 23b is a schematic diagram of a bottom portion structure of a groove conductive beam according to a preferred embodiment of the present invention
Figure 23C:
FIG. 23c is a schematic diagram of a bottom portion structure of a groove conductive beam according to a preferred embodiment of the present invention
Figure 23D:
FIG. 23d is a schematic diagram of a bottom portion structure of a groove conductive beam according to a preferred embodiment of the present invention

In the present embodiment, since each of the conductive metal layer and/or the upper release protection layer and/or the lower release protection layer is simultaneously deposited in the pattern of the second conductive trench, the pattern of the protrusion, the pattern of the top layer conductive beam and the pattern of the upper portion of the first conductive trench, it is possible to fully fill these patterns to form a solid, and it is also possible not to fully fill these patterns to form a groove, wherein the protrusion may or may not be fully filled to form a solid or a groove, and thus the structure of the conductive beam, the protrusions, the first conductive trench and the second conductive trench includes any combination of a solid or groove conductive beam, solid or groove protrusions, a solid first conductive trench or a groove first conductive structure, and a solid second conductive structure or a groove second conductive trench, which are all within the scope of the present invention. The four kinds of structures of the solid conductive beam and the protrusions at the bottom portion thereof are shown in FIGS. 22a-22d, and the four kinds of structures of the groove conductive beam and the groove protrusions at the bottom portion thereof are shown in FIGS. 23a-23d. Wherein, the position of the groove protrusion in FIG. 23a is the same as the position of the solid groove protrusion in FIG. 22a; the position of the groove protrusion in FIG. 23b is the same as the position of the solid groove protrusion in FIG. 22b; the position of the groove protrusion in FIG. 23c is the same as the position of the solid groove protrusion in FIG. 22c; the position of the groove protrusion in FIG. 23d is the same as the position of the solid groove protrusion in FIG. 22d. With respect to the position of the groove protrusion relative to conductive beam in FIGS. 23a-23d, it may be referred to the position of the solid protrusion relative to the conductive beam in FIGS. 22a-22d and details will not repeatedly be described herein again. In addition, in the present embodiment, the first conductive trench and the second conductive trench may be fully filled with conductive metal to form a shape of the conductive pillar.

Figure 2:
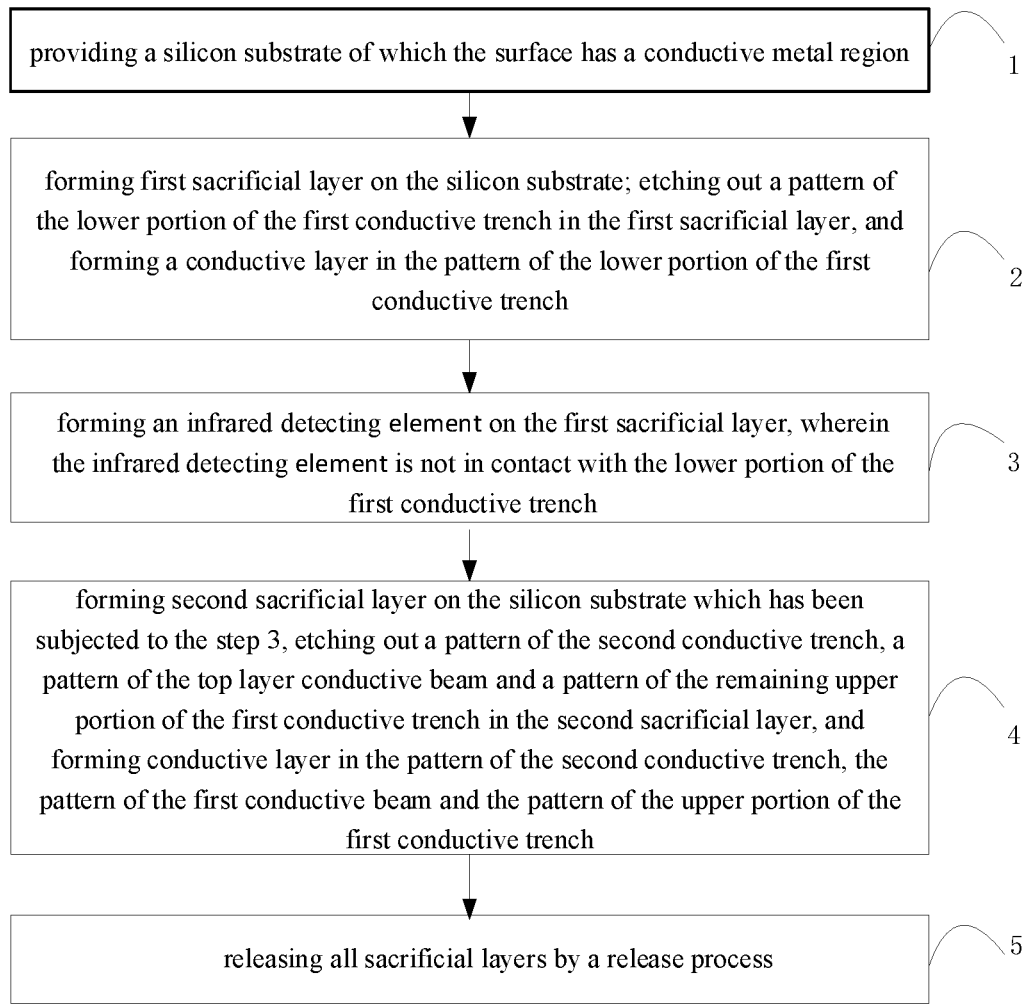
FIG. 2 is a schematic flow chart of a manufacturing method of an infrared detector pixel structure according to Embodiment 1 of the present invention.
Figure 3:
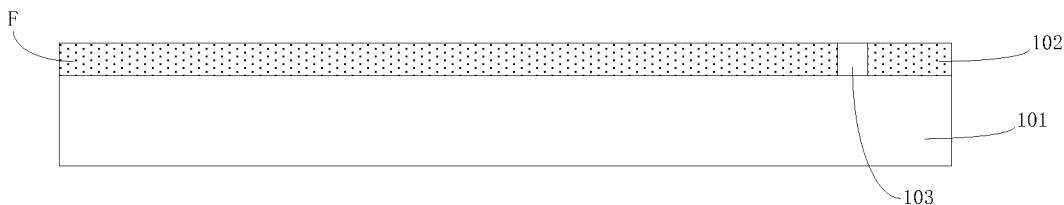
FIGS. 3-7 are schematic diagrams of respective manufacturing steps of a manufacturing method of an infrared detector pixel structure according to Embodiment 1 of the present invention

Referring to FIG. 2, in the present embodiment, a method for manufacturing the above infrared detector pixel structure comprises of:

Step 1: referring to FIG. 3, providing a silicon substrate 101, wherein the surface of the silicon substrate 101 has a conductive metal region 102. Herein, the surface of the silicon substrate 101 further has a reflective region F and a dielectric region 103 located between the conductive metal region 102 and the reflective region F; an interconnection layer is included in the silicon substrate 101 and is electrically connected to the conductive metal region 102, and the interconnection layer is connected to an external circuit.

Figure 4:
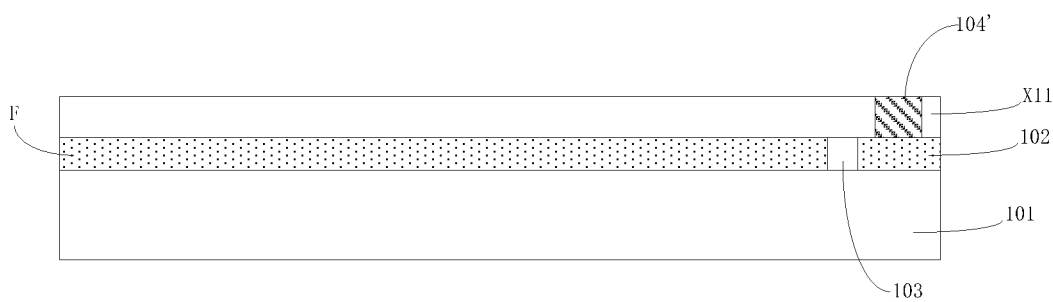

Step 2: referring to FIG. 4, forming a first sacrificial layer X11 on the silicon substrate 101; etching out a pattern 104' of the lower portion of the first conductive trench in the first sacrificial layer X11, and forming a conductive metal layer in the pattern 104' of the lower portion of the first conductive trench so as to form the lower portion of the first conductive structure;

Specifically, the step 2 comprises of:

Firstly, forming first sacrificial layer X11 on the silicon substrate 101;

Then, etching out a pattern 104' of the lower portion of the first conductive trench in the first sacrificial layer X11; herein, only the pattern 104' of the lower portion of the first conductive trench is manufactured, and a pattern of the remaining upper portion of the first conductive trench is continued to form in subsequent second sacrificial layer X12, thereby forming the final first conductive trench of which bottom portion is located at the first sacrificial layer X1 l and top portion is located at the second layer X12.

Next, in the pattern 104' of the lower portion of the first conductive trench, sequentially forming a lower release protection layer, a conductive metal layer and an upper release protection layer, or forming a conductive metal layer and an upper release protection layer, or only forming a conductive metal layer; and there is a gap between the conductive metal layers located at sidewalls of the pattern of the lower portion of the first conductive trench; or the conductive metal layer fully fills the pattern of the lower portion of the first conductive trench to form a conductive pillar.

The upper release protection layer and the lower release protection layer are used to protect the conductive metal layer from not being damaged during a release process, thereby ensuring conductivity and sensitivity of the device; the conductive material may be conductive metal such as aluminum, copper, etc.; if the conductive material is aluminum, it is unnecessary to form an upper release protection layer and a lower release protection layer;

After depositing the conductive metal layer, the method further comprises of: planarizing the conductive metal layer to remove the conductive metal layer higher than the surface of the first sacrificial layer X11.

Figure 5:
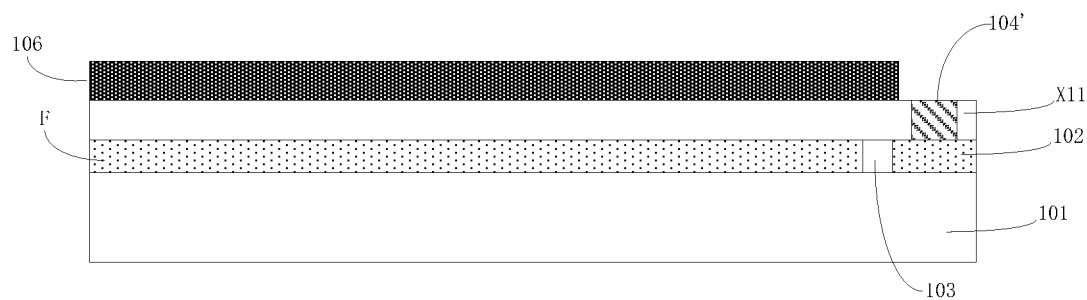

Step 3: referring to FIG. 5, forming an infrared detecting element on the first sacrificial layer X11, wherein the infrared detecting element is not in contact with the lower portion 104' of the first conductive trench;

Specifically, the electrode layer of the micro-bridge structure 106 is not in contact with the top portion of the pattern 104' of the lower portion of the first conductive trench in the first sacrificial layer X11 that has been manufactured.

Figure 6:
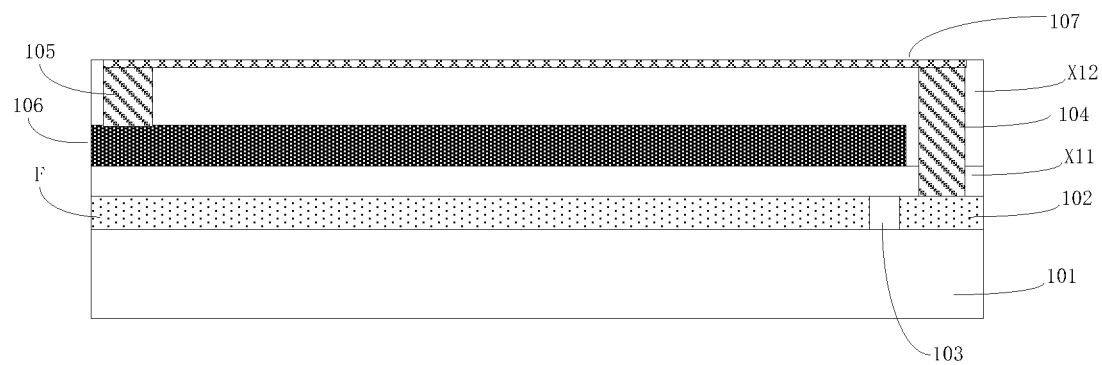

Step 4: referring to FIG. 6, forming second sacrificial layer X12 on the silicon substrate 101 which has been subjected to the step 3, etching out a pattern of the second conductive trench, a pattern of the top layer conductive beam and a pattern of the remaining upper portion of the first conductive trench in the second sacrificial layer X12, and depositing conductive material in the pattern of the second conductive trench, the pattern of the top layer conductive beam and the pattern of the lower portion of the first conductive trench to form the first conductive trench 104, the second conductive trench 105 and the top layer conductive beam 107;

Specifically, firstly, a pattern of the protrusion, a pattern of the second conductive trench, and a pattern of the remaining upper portion of the first conductive trench are formed in the second sacrificial layer X12 corresponding to the pattern of the top layer conductive beam; then, the pattern of top layer conductive layer is formed. For a description of the pattern of the protrusion, it may be referred to the above description about the protrusions, which will not be repeatedly described herein again, so that the conductive layer to be subsequently deposited is also deposited in the pattern of the protrusions to form the top layer conductive beam with protrusions at the bottom portion. Here, the micro-bridge structure 106 is in contact with the bottom portion of the second conductive trench 105; the process of forming the conductive metal layer includes that:

In a pattern of the second conductive trench, a pattern of the protrusions, a pattern of the top layer conductive beam and a pattern of the upper portion of the first conductive trench, a lower release protection layer, a conductive metal layer and an upper release protection layer are sequentially formed, or a conductive metal layer and an upper release protection layer are formed, or only a conductive metal layer is formed, and there is gap between the conductive metal layers located on the sidewall of the first conductive trench, and there is gap between the conductive metal layers located on the sidewall of the second conductive trench; or the conductive metal layer fully fills the pattern of the second conductive trench and the pattern of remaining upper portion of the first conductive trench, and the first conductive trench and the second conductive trench are a shape of a conductive pillar. In the present embodiment, since each of the conductive metal layer and/or the upper release protection layer and/or the lower release protection layer is simultaneously located in the pattern of the second conductive trench, the pattern of the protrusions, the pattern of the top layer conductive beam, and the pattern of the upper portion of the first conductive trench, it is possible to fully fill these patterns to form a solid, and it is also possible not to fully fill these patterns to form a groove, wherein the protrusions may or may not be fully filled to form a solid or a groove, and thus the structure of the conductive beam, the protrusions, the first conductive trench and the second conductive trench includes any combination of a solid or groove conductive beam, solid or groove protrusions, a solid first conductive trench or a groove first conductive structure, and a solid second conductive structure or a groove second conductive trench, which are all within the scope of the present invention.

After forming the conductive metal layer, it is further comprised of: planarizing the conductive metal layer to remove the conductive metal layer which is higher than the surface of the second sacrificial layer X12; the micro-bridge structure 106 is in contact with the bottom portion of the second conductive trench 105.

Figure 7:
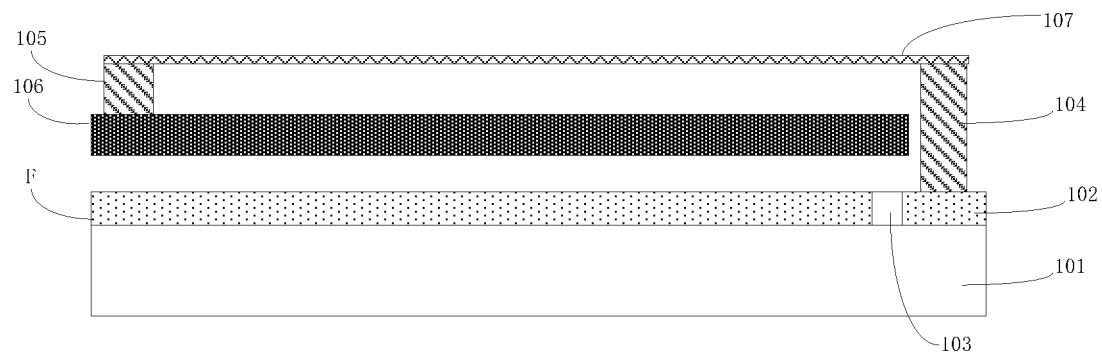

Step 5: referring to FIG. 7, releasing all the sacrificial layers X11, X12 by a release process.

Specifically, the release process can set appropriate process parameters according to material of the sacrificial layers, and details will not be described herein again.

Embodiment 2

The present invention will be further described in detail below with reference to FIGS. 8a-14 and specific embodiments. It should be noted that the drawings are made by adopting a very simplified form and using a non-precise ratio, and the purpose thereof is to auxiliary explain the present embodiment in an easy and clear way.

Figure 9A:
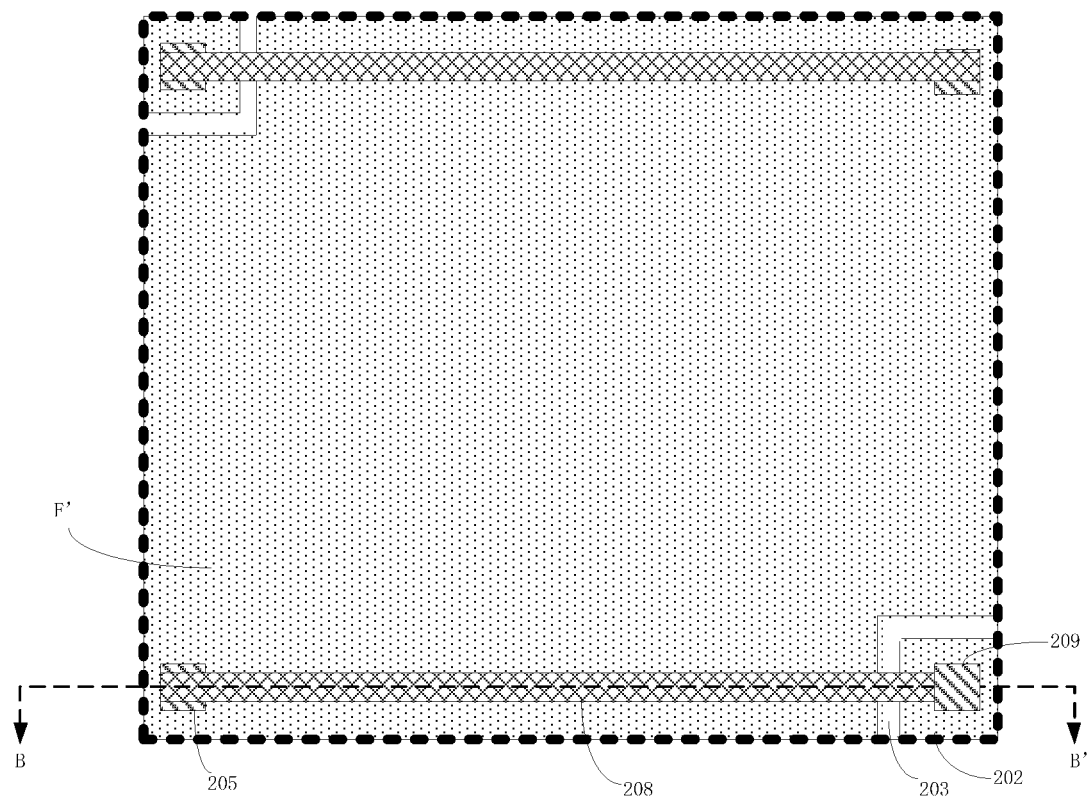
FIG. 9a is a top structural schematic diagram of an infrared detector pixel structure according to Embodiment 2 of the present invention
Figure 9B:
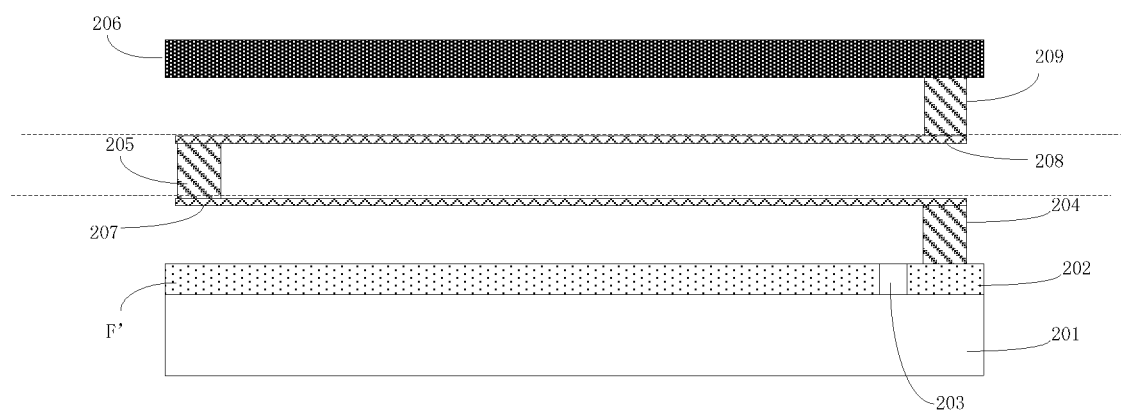
FIG. 9b is a side structural schematic diagram of an infrared detector pixel structure according to Embodiment 2 of the present invention

In this embodiment, please refer to FIG. 9a and FIG. 9b, FIG. 9b is a schematic diagram of the cross-sectional structure along BB' in FIG. 9a. In FIG. 9a, the micro-bridge structure is removed for convenience of representation, and the region occupied by the micro-bridge structure is represented by a thick dotted line frame. The infrared detector pixel structure is located on a silicon substrate 201 with an interconnection layer (not shown) therein, and the surface of the silicon substrate 201 has a conductive metal region 202 electrically connected to the interconnection layer, a reflective region F' and a dielectric region 203 between the conductive metal region 202 and the reflective region F'; the interconnection layer is connected to an external circuit. It should be noted that the interconnection layer in this embodiment can be replaced with other conductive structures connectable to the conductive metal region and the external circuit. The pixel structure of the present embodiment further includes:

A micro-bridge structure 206 which is located above the reflective region F' for detecting infrared light and generating electrical signal; the micro-bridge structure of the present embodiment 2 is the same as the micro-bridge structure of the embodiment 1. Please refer to FIG. 1c again, the micro-bridge structure may include the lower release protection layer 1063, the infrared sensitive material layer 1061, the electrode layer 1062 and the upper release protection layer 1064. The electrode layer 1062 is connected to the top portion of the third layer conductive trench 209 to ensure that electrical signal generated by the micro-bridge structure 206 are transmitted to the conductive metal region 102 via the conductive beam to be further transmitted to the interconnection layer and the external circuit.

A conductive beam unit which is electrically connected to the micro-bridge structure 206. In the conductive beam unit, the bottom portion of every layer conductive trench and the top portion of a conductive trench which an adjacent layer below the conductive trench is are connected to the same conductive beam unit and are respectively connected to two ends of the conductive beam. Only the top layer conductive trench is located in the topmost layer of the conductive beam unit, the top portion of the top layer conductive trench is connected to the infrared detecting element, that is, the conductive trenches of the adjacent layers are electrically connected by the conductive beam; in the conductive trenches of the adjacent layers, the top portion of the conductive trench located at the lower layer is connected to the bottom portion of the conductive trench located at the upper layer by the conductive beam; herein, as shown in FIG. 9b, the conductive beam unit is divided into two layers, the first layer is below the dotted line L1, the second layer is between the dotted line L1 and the dotted line L2, the third layer is above the dotted line L3; the conductive beam unit has two layers including first layer conductive beam 207 and second layer conductive beam 208; the multilayer conductive trenches has three layers which are respectively first layer conductive trench 204, second layer conductive trench 205 and third layer conductive trench 209 (top layer conductive trench); the bottom portion of the first layer conductive trench 204 is in contact with the conductive metal region 202; the top portion of the first layer conductive trench 204 is connected to the bottom portion of the second layer conductive trench 205 by the first layer conductive beam 207; the top portion of the second layer conductive trench 205 is connected to the bottom portion of the third layer conductive trench 209 by the second layer conductive beam 208; the bottom portion of the third layer conductive trench 209 located at the topmost layer is connected to the second layer conductive beam 208, and the top portion of the third layer conductive trench 209 is in contact with the micro-bridge structure 206, thereby making the micro-bridge structure 206 be located above the conductive beam unit. The electrical signal generated by the micro-bridge structure 206 is firstly transmitted to the bottom portion of the third layer conductive trench 209 via the top portion of the third layer conductive trench 209 at the topmost layer, next transmitted to the top portion of the second layer conductive trench 205 via the second layer conductive beam 208, transmitted to the top portion of the first layer conductive trench 204 from the top portion of the second layer conductive trench 205 via the first layer conductive beam 207, then transmitted to the bottom portion of the first layer conductive trench 204 from the top portion of the first layer conductive trench 204, further transmitted to the conductive metal region 202 and thus transmitted to the interconnection layer and the external circuit from the conductive metal region 202. Wherein the second layer conductive trench 205 is located above the reflective region F', and the first layer conductive trench 204 is located on the metal conductive region 202. Wherein, the micro-bridge structure 206 is located above the conductive beam unit, and the conductive trench and the conductive beam at each layer constitute a structure with a circuitous stepwise shape such that a transmission path of the electrical signal generated by the micro-bridge structure 206 is a circuitous stepwise shape.

There are cavities below the micro-bridge structure 206, between the conductive beams 207, 208 and below the conductive beams 207, 208.

Therefore, the present embodiment achieves a stepwise transmission of the electrical signal in the longitudinal direction, reduces the lateral occupied area of the device and increases the integration density of the pixel structure, that is, increases fill factor of the pixel structure.

Referring to FIG. 8a again, the structure inside the dotted line frame indicates conductive trench, the structure outside the dotted line frame indicates the conductive beam, and the conductive beam may be constituted by a conductive metal layer M and an upper release protection layer S1 and a lower release protection layer S2 which surround the conductive metal layer M; correspondingly, the conductive trench may be constituted by the upper release protection layer S1, the lower release protection layer S2 and the conductive metal layer M between the upper release protection layer S1 and the lower release protection layer S2.

Referring to FIG. 8b again, the structure inside the dotted line frame indicates the conductive trench, the structure outside the dotted line frame indicates the conductive beam, and the conductive beam may be constituted by a conductive metal layer M and a release protection layer S which is located on the upper surface of the conductive metal layer M; correspondingly, the conductive trench may be constituted by the conductive metal layer M and the release protection layer S which is located on the conductive metal layer M.

Referring to FIG. 8c again, in FIG. 8c, the structure inside the dotted line frame at right indicates the conductive trench, the structure outside the dotted line frame indicates the conductive beam, and the cross-sectional view of the dotted line direction is shown as left of FIG. 8c, and the conductive beam may be constituted by the conductive metal layer M; correspondingly, the conductive trench may be constituted by the conductive metal layer M.

In the present embodiment, the bottom portion of the first layer conductive beam 207 and the bottom portion of the second layer conductive beam 208 in the conductive beam unit have protrusions, as shown in FIGS. 22a-22d, and the detail will not be repeatedly described herein. In addition, in the present embodiment, the conductive trench may also be fully filled with the conductive metal, to form a shape of a conductive pillar.

Since each of the conductive metal layer and/or the upper release protection layer and/or the lower release protection layer is simultaneously deposited in the pattern of the first layer conductive trench 204, the pattern of the first layer conductive beam 207 and the pattern of the protrusions at its bottom portion, or simultaneously deposited in the pattern of the second layer conductive trench 205, the pattern of the second layer conductive beam 208 and the pattern of the protrusions at its bottom portion, it is possible to fully fill these patterns to form a solid, and it is also possible not to fully fill these patterns to form a groove, and thus the structure of combination of the first layer conductive beam and protrusions at its bottom portion and the first layer conductive trench includes any combination of a solid or groove first layer conductive beam, solid or groove protrusions at the bottom portion of the first layer conductive beam, and a solid or groove first layer conductive trench, and the structure of combination of the second layer conductive beam and protrusions at its bottom portion and the second layer conductive trench includes any combination of a solid or groove second layer conductive beam, solid or groove protrusions at the bottom portion of the second layer conductive beam, and a solid or groove second layer conductive trench, which are all within the scope of the present invention. As FIGS. 22a-22d which show four kinds of structures of the solid conductive beam and the protrusions at the bottom portion thereof, FIGS. 23a-23d show four kinds of structures of the groove conductive beam and the groove protrusions at the bottom portion thereof. Wherein, the position of the groove protrusion in FIG. 23a is the same as the position of the solid groove protrusion in FIG. 22a; the position of the groove protrusion in FIG. 23b is the same as the position of the solid groove protrusion in FIG. 22b; the position of the groove protrusion in FIG. 23c is the same as the position of the solid groove protrusion in FIG. 22c; the position of the groove protrusion in FIG. 23d is the same as the position of the solid groove protrusion in FIG. 22d; with respect to the position of the groove protrusion relative to the groove conductive beam in FIGS. 23a-23d, it may be referred to the position of the solid protrusion relative to the solid conductive beam in FIGS. 22a-22d and details will not repeatedly described herein again.

Figure 10:
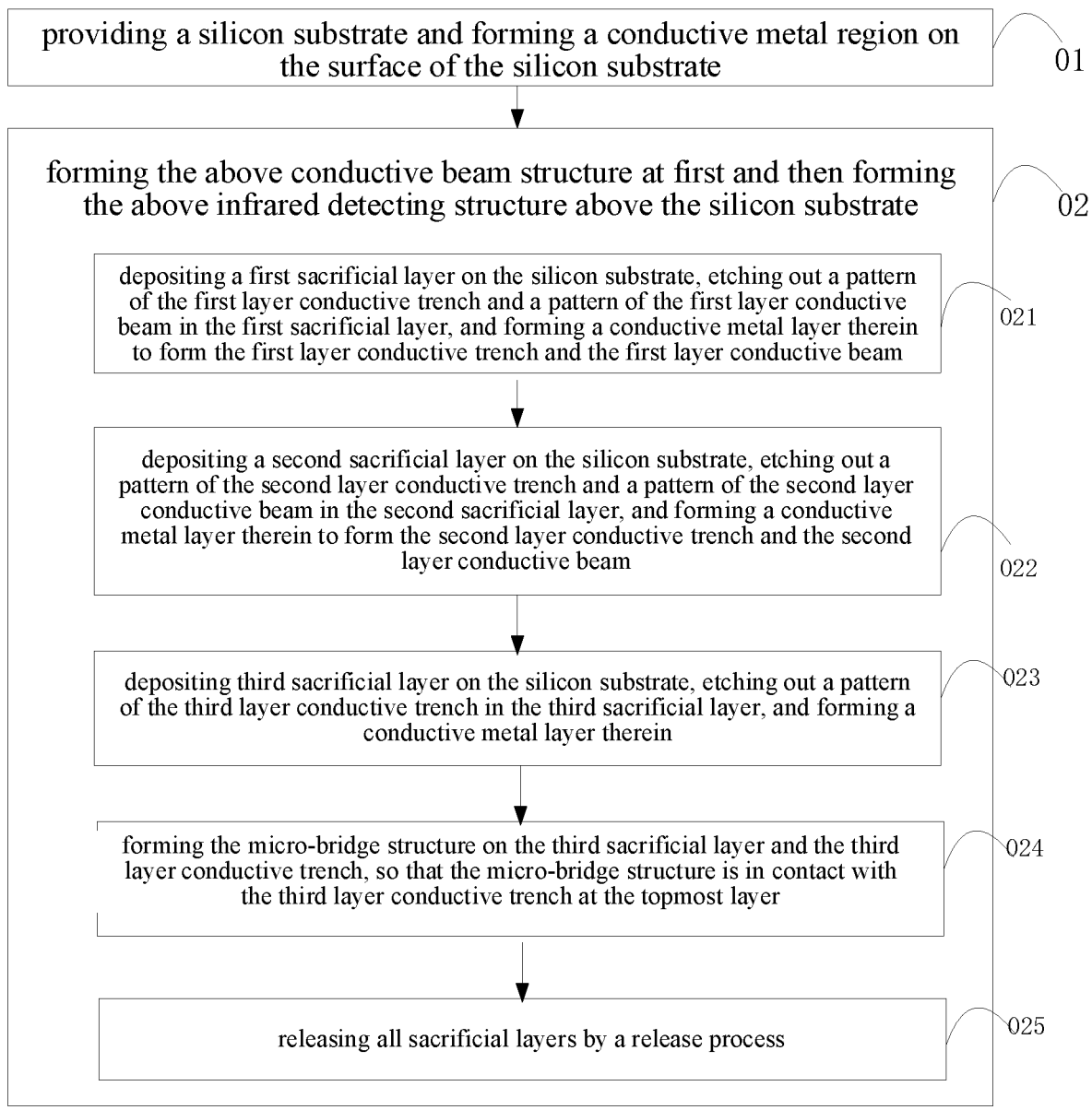
FIG. 10 is a schematic flow chart of a manufacturing method of an infrared detector pixel structure according to Embodiment 2 of the present invention
Figure 11:
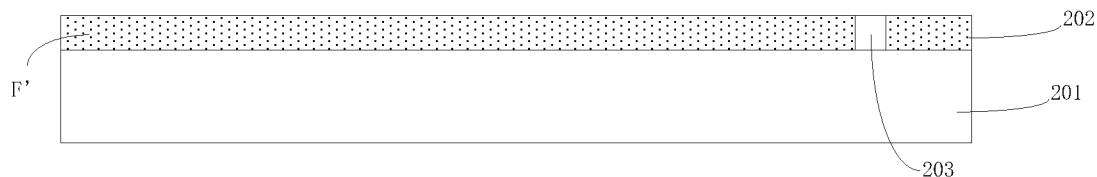
FIGS. 11-14 are schematic diagrams of respective manufacturing steps of a manufacturing method of an infrared detector pixel structure according to Embodiment 2 of the present invention

Referring to FIG. 10, in the present embodiment, a method for manufacturing the above infrared detector pixel structure comprises of:

Step 01: referring to FIG. 11, providing a silicon substrate 201 and forming an interconnection layer and a conductive metal region 202 electrically connected to the interconnection layer on the surface of the silicon substrate 201; herein, the interconnection layer and the conductive metal region 202 are electrically connected each other; the surface of the silicon substrate 201 further has a reflective region F' and a dielectric region 203 located between the conductive metal region 202 and the reflective region F'; the interconnection layer is connected to an external circuit;

Step 02: forming the above conductive beam unit at first and then forming the above infrared detecting element above the silicon substrate 201; wherein the infrared detecting element is in contact with one layer of the conductive beam unit or the conductive trench in the conductive beam unit, and bottom portion of another layer of the conductive trench in the conductive beam unit is in contact with the conductive metal region.

Figure 12:
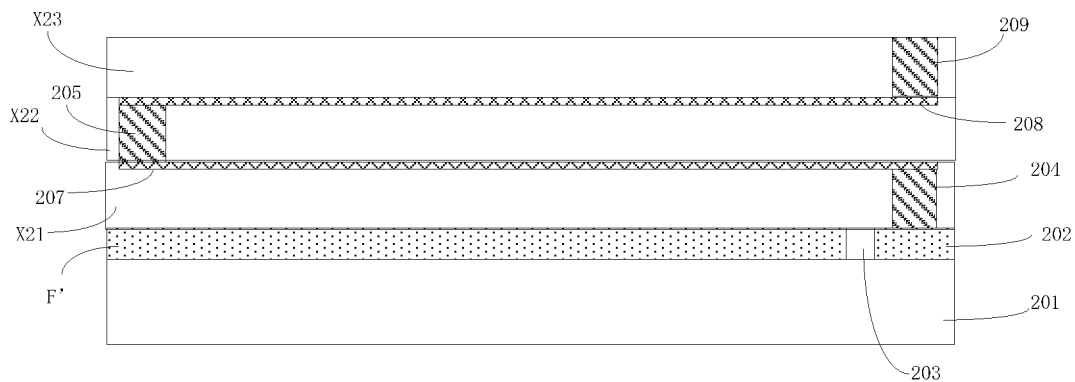

Specifically, referring to FIG. 12, the manufacturing process of the conductive beam unit comprises of:

Step 021, depositing a first sacrificial layer X21 on the silicon substrate 201, etching out a pattern of the first layer conductive trench 204 and a pattern of the first layer conductive beam 207 in the first sacrificial layer, and forming a conductive metal layer therein to form the first layer conductive trench 204 and the first layer conductive beam 207; herein the process further comprises of, after forming the conductive metal layer, planarizing the conductive metal layer to remove the conductive metal layer which is higher than the surface of the first sacrificial layer X21. In addition, in this embodiment, since the bottom portion of the first layer conductive beam 207 has protrusions, pattern of these protrusions is formed in the first sacrificial layer X21 below the pattern corresponding to the first layer conductive beam 207 before the pattern of the first layer conductive beam 207 is formed; for the description of the protrusion pattern, it may be referred to the above description of protrusions, and it will not be repeatedly described herein again, so that the subsequently deposited conductive metal layer is also deposited in the protrusion pattern to form the first layer conductive beam 207 of which the bottom portion has protrusions. Then, the formed lower release protection layer, the conductive metal layer and the upper release protection layer, or the conductive metal layer and the upper release protection layer, or the conductive metal layer are also simultaneously located in the protrusion pattern, thereby forming the protrusions located at the bottom portion of the first layer conductive beam 207.

Step 022, depositing a second sacrificial layer X22 on the silicon substrate 201, etching out a pattern of the second layer conductive trench 205 and a pattern of the second layer conductive beam 208 in the second sacrificial layer, and forming a conductive metal layer therein to form the second layer conductive trench 205 and the second layer conductive beam 208; herein the process further comprises of, after forming the conductive metal layer, planarizing the conductive metal layer to remove the conductive metal layer which is higher than the surface of the second sacrifice layer X22. In addition, in the present embodiment, since the bottom portion of the second layer conductive beam 208 has protrusions, pattern of these protrusions is formed in the second sacrificial layer X22 below the pattern corresponding to the second layer conductive beam 208 before the pattern of the second layer conductive beam 208 is formed; for the description of the protrusion pattern, it may be referred to the above description of protrusions, and it will not be repeatedly described herein again, so that the subsequently deposited conductive layer is also deposited in the protrusion pattern to form the second layer conductive beam 208 of which the bottom portion has protrusions. Then, the formed lower release protection layer, the conductive metal layer and the upper release protection layer, or the conductive metal layer and the upper release protection layer, or the conductive metal layer are also simultaneously located in the protrusion pattern, thereby forming the protrusions located at the second layer conductive beam 208. It should be noted that, since each of the conductive metal layer and/or the upper release protection layer and/or the lower release protection layer is simultaneously deposited in the pattern of the first layer conductive trench 204, the pattern of the first layer conductive beam 207 and the protrusion pattern at its bottom portion, or simultaneously deposited in the pattern of the second layer conductive trench 205, the pattern of the second layer conductive beam 208 and the protrusion pattern at its bottom portion, it is possible to fully fill these patterns to form a solid, and it is also possible not to fully fill these patterns to form a groove, and thus the structure of combination of the first layer conductive beam 207 and protrusions at its bottom portion and the first layer conductive trench includes any combination of a solid or groove first layer conductive beam 207, solid or groove protrusions at the bottom portion of the first layer conductive beam 207, and a solid or groove first layer conductive trench, and the structure of combination of the second layer conductive beam 208 and protrusions at its bottom portion and the second layer conductive trench includes any combination of a solid or groove second layer conductive beam 208, solid or groove protrusions at the bottom portion of the second layer conductive beam 208, and a solid or groove second layer conductive trench, which are all within the scope of the present invention.

Step 023, depositing third sacrificial layer X23 on the silicon substrate 201, etching out a pattern of the third layer conductive trench 205 in the third sacrificial layer X23, and forming a conductive metal layer therein; herein the process further comprises of, after forming the conductive metal layer, planarizing the conductive metal layer to remove the conductive metal layer which is higher than the surface of the third sacrificial layer X23 to form the third layer conductive trench 209, thereby completing the manufacture of the conductive beam unit.

In the Step 02, the process of forming the conductive metal layer in the pattern of each layer may specifically comprise of: sequentially forming a lower release protection layer, a conductive metal layer, and an upper release protection layer in the conductive trench and/or the conductive beam; or sequentially forming a conductive metal layer and a release protection layer in the conductive trench and/or the conductive beam; or only forming a conductive metal layer in the conductive trench and/or the conductive beam; there may be gaps between the conductive metal layers located at sidewall of the conductive trench; if the conductive trench is fully filled with the conductive metal layer, the conductive trench is a shape of a conductive pillar.

The material of the conductive metal layer may be conductive metal such as aluminum, copper, etc.; if the material is aluminum, it is unnecessary to form the upper release protection layer and the lower release protection layer; the upper release protection layer and the lower release protection layer are used to protect the conductive metal layer from not being damaged during a release process, thereby ensuring conductivity and sensitivity of the device.

Figure 13:
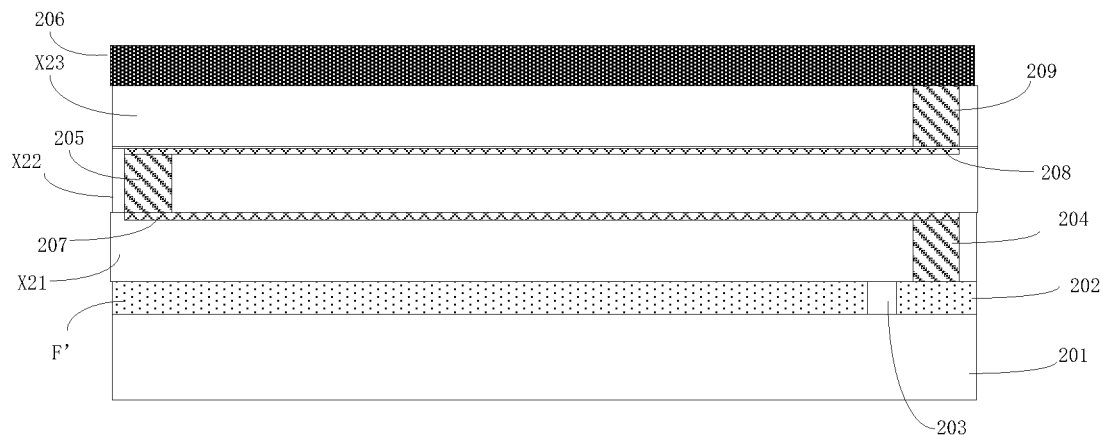

The manufacture of the micro-bridge structure in the Step 02 specifically comprises of step 024: referring to FIG. 13, forming the micro-bridge structure 206 on the third sacrificial layer X23 and the third layer conductive trench 209, so that the micro-bridge structure 206 is in contact with the third layer conductive trench 209 at the topmost layer.

Figure 14:
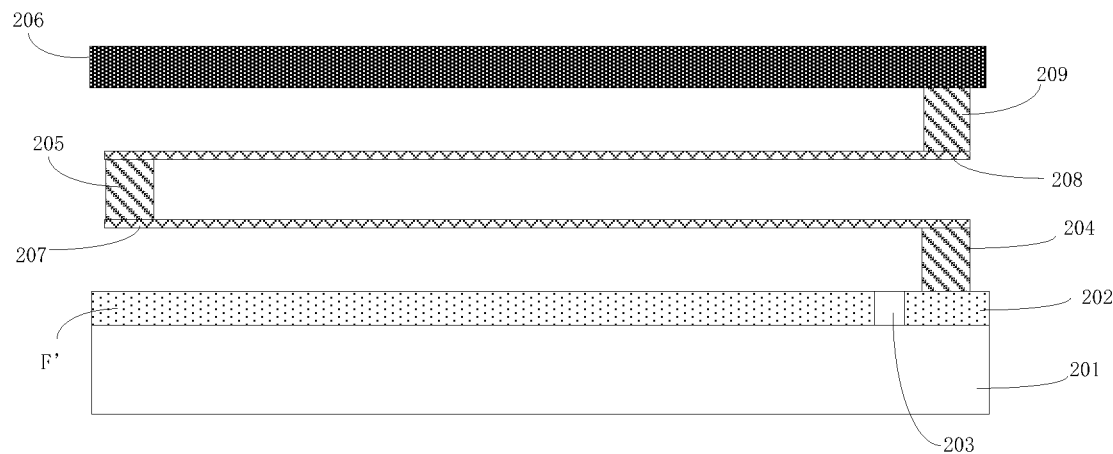

After the micro-bridge structure is manufactured, step 025 is included: referring to FIG. 14, all the sacrificial layers are released by the release process. Specifically, the release process can set appropriate process parameters according to the material of the sacrificial layers, and details will not be described herein again.

Embodiment 3

The present invention will be further described in detail below with reference to FIGS. 15a-21 and specific embodiments. It should be noted that the drawings are made by adopting a very simplified form and using a non-precise ratio, and the purpose thereof is to auxiliarily explain the present embodiment in an easy and clear way.

Figure 15A:
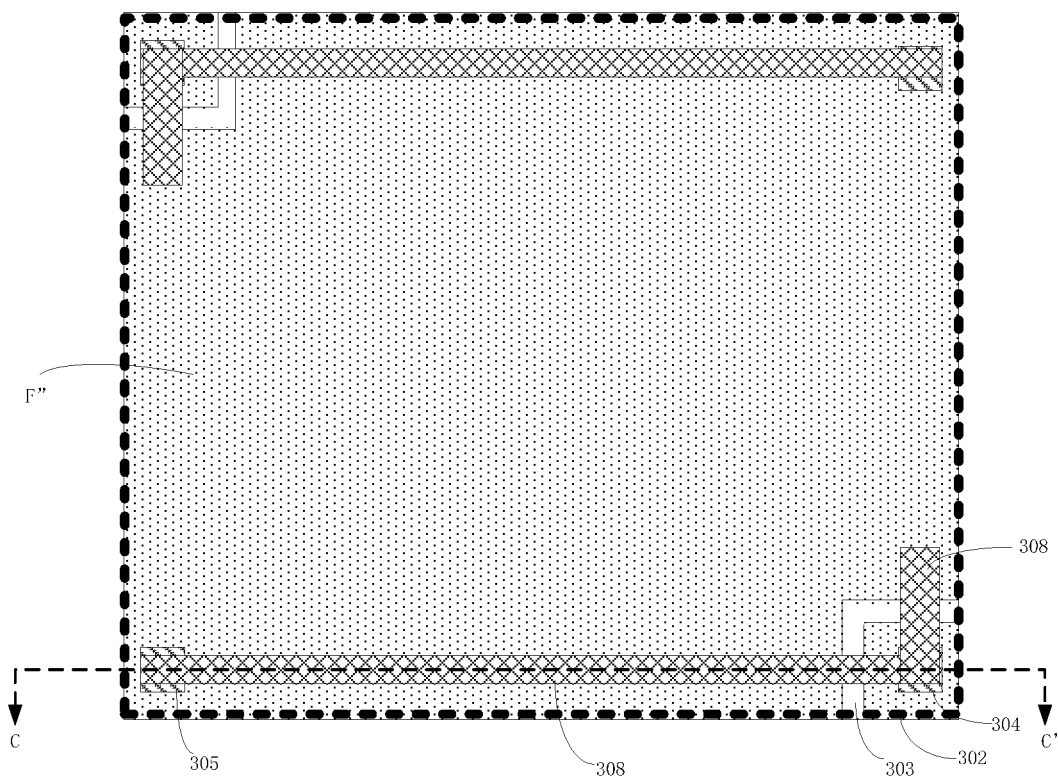
FIG. 15a is a top structural schematic diagram of an infrared detector pixel structure according to Embodiment 3 of the present invention
Figure 15B:
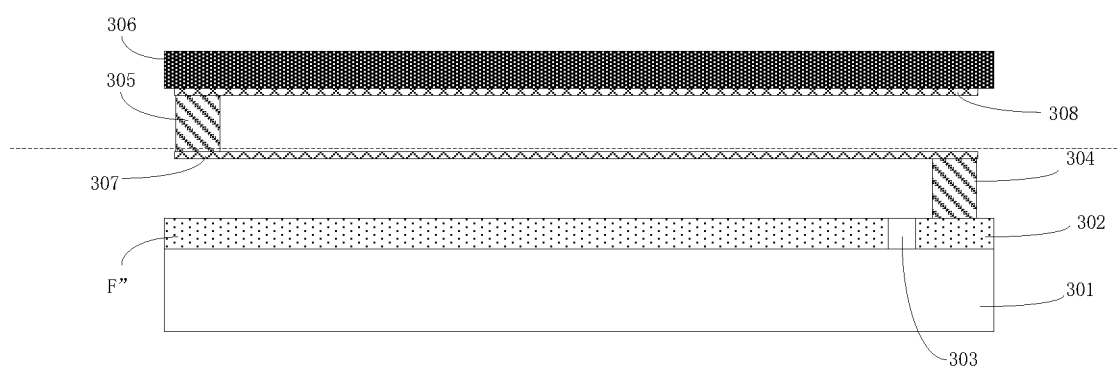
FIG. 15b is a side structural schematic diagram of an infrared detector pixel structure according to Embodiment 3 of the present invention

In the present embodiment, referring to FIG. 15a and FIG. 15b, FIG. 15b is a schematic diagram of the cross-sectional structure along CC' in FIG. 15a. In FIG. 15a, the micro-bridge structure is removed for convenience of representation, and the region occupied by the micro-bridge structure is represented by a thick dotted line frame. The infrared detector pixel structure is located on a silicon substrate 301 in which there is an interconnection layer (not shown), and the surface of the silicon substrate 301 has a conductive metal region 302 electrically connected to the interconnection layer, a reflective region 303 and a dielectric region 303 between the conductive metal region 302 and the reflective region 303; the interconnection layer is connected to an external circuit; it should be noted that the interconnection layer in the present embodiment may be replaced with other conductive structures which can be connected to the conductive metal regions and the external circuit. The infrared detector pixel structure of the present embodiment further includes:

A micro-bridge structure 306 which is located above the reflective region F″ for detecting infrared light and generating electrical signal. The micro-bridge structure of the present embodiment 3 may be the same as the micro-bridge structure of the embodiment 1. Referring to FIG. 1c again, the micro-bridge structure may include the lower release protection layer 1063, the infrared sensitive material layer 1061, the electrode layer 1062 and the upper release protection layer 1064. The electrode layer 1062 is connected to the conductive beam 308 of the conductive beam unit to ensure that electrical signal generated by the micro-bridge structure 306 are transmitted to the conductive metal region 302 via the conductive beam unit to be further transmitted to the interconnection layer and the external circuit.

The conductive beam unit is electrically connected to the micro-bridge structure 306. In the conductive beam unit, there are second conductive trench 305 (top layer conductive trench) and second conductive beam 308 (top layer conductive beam) in the topmost layer of the conductive beam unit as shown in FIG. 15b. The conductive beam unit is divided into two layers, the first layer is below the dotted line, and the second layer is above the dotted line. In the present embodiment, there are two layers of conductive trenches which are respectively a first layer conductive trench 304 and a second layer conductive trench 305, and there may be one conductive beam or multilayer conductive beams. There are two layers conductive beams which are a first layer conductive beam 307 and a second layer conductive beam 308 herein. The top portion of the first layer conductive trench 304 is connected to the bottom portion of the second layer conductive trench 305 by the first layer conductive beam 307; the bottom portion of the first layer conductive trench 304 is in contact with the conductive metal region 302, the top portion of the second layer conductive trench 305 is connected to one end of the second layer conductive beam 308, and another end of second layer conductive beam 308 is in contact with the micro-bridge structure 306, thereby making the micro-bridge structure 306 be located above the conductive beam unit; the conductive trench and the conductive beam at each layer constitute a structure with a circuitous stepwise shape such that a transmission path of the electrical signal generated by the infrared detecting element is a circuitous stepwise shape. The electrical signal generated by the micro-bridge structure 306 is firstly transmitted to the top portion of the second layer conductive trench 305 via the second layer conductive beam 308, next transmitted to the bottom portion of the second layer conductive trench 305, then transmitted to the top portion of the first layer conductive trench 304 via the first layer conductive beam 307, finally transmitted to the conductive metal region 302 via the bottom portion of the first layer conductive trench 304, and thus transmitted to the interconnection layer by the conductive metal region 302 and further transmitted to the external circuit; wherein the second layer conductive trench 305 is located above the reflective region F'', and the first layer conductive trench 304 is located on the metal conductive region 302.

It is empty below the micro-bridge structure 306, between the conductive beams 307, 308 and below the conductive beam 307.

Therefore, the present embodiment achieves a stepwise transmission of the electrical signal in the longitudinal direction, reduces the lateral occupied area of the device and increases the integration density of the pixel structure, that is, increases fill factor of the pixel structure.

Referring to FIG. 8a again, the structure inside the dotted line frame indicates conductive trench, the structure outside the dotted line frame indicates the conductive beam, and the conductive beam may be constituted by a conductive metal layer M and an upper release protection layer S1 and a lower release protection layer S2 which surround the conductive metal layer M; correspondingly, the conductive trench may be constituted by the upper release protection layer S1, the lower release protection layer S2 and the conductive metal layer M between the upper release protection layer S1 and the lower release protection layer S2.

Referring to FIG. 8b again, the structure inside the dotted line frame indicates the conductive trench, the structure outside the dotted line frame indicates the conductive beam, and the conductive beam may be constituted by a conductive metal layer M and a release protection layer S which is located on the upper surface of the conductive metal layer M; correspondingly, the conductive trench may be constituted by the conductive metal layer M and the release protection layer S which is located on the upper surface of the conductive metal layer M.

Referring to FIG. 8c again, in FIG. 8c, the structure inside the dotted line frame at right indicates the conductive trench, the structure outside the dotted line frame indicates the conductive beam, and the cross-sectional view of the dotted line direction is shown as left of FIG. 8c, and the conductive beam may be constituted by the conductive metal layer M; correspondingly, the conductive trench may be constituted by the conductive metal layer M.

In the present embodiment, the bottom portion of the first layer conductive beam 307 and the bottom portion of the second layer conductive beam 308 in the conductive beam have a plurality of protrusions, as shown in FIGS. 22a-22d, and for the detail description of the protrusions, it may be referred to the above description, and will not be repeatedly described herein again.

In the present embodiment, since each of the conductive metal layer and/or the upper release protection layer and/or the lower release protection layer is simultaneously deposited in the pattern of the first layer conductive trench 304, the pattern of the first layer conductive beam 307 and the protrusion pattern at its bottom portion, or simultaneously deposited in the pattern of the second layer conductive trench 305, the pattern of the second layer conductive beam 308 and the protrusion pattern at its bottom portion, it is possible to fully fill these patterns to form a solid, and it is also possible not to fully fill these patterns to form a groove, and thus the structure of combination of the first layer conductive beam 307 and protrusions at its bottom portion and the first layer conductive trench 304 includes any combination of a solid or groove first layer conductive beam 307, solid or groove protrusions at the bottom portion of the first layer conductive beam unit 307, and a solid or groove first layer conductive trench 304, and the structure of combination of the second layer conductive beam unit 308 and protrusions at its bottom portion and the second layer conductive trench 305 includes any combination of a solid or groove second layer conductive beam 308, solid or groove protrusions at the bottom portion of the second layer conductive beam 308, and a solid or groove second layer conductive trench 305, which are all within the scope of the present invention. As FIGS. 22a-22d which show four kinds of structures of the solid conductive beam and the protrusions at the bottom portion thereof, FIGS. 23a-23d show four kinds of structures of the groove conductive beam and the groove protrusions at the bottom portion thereof. Wherein, the position of the groove protrusion in FIG. 23a is the same as the position of the solid groove protrusion in FIG. 22a; the position of the groove protrusion in FIG. 23b is the same as the position of the solid groove protrusion in FIG. 22b; the position of the groove protrusion in FIG. 23c is the same as the position of the solid groove protrusion in FIG. 22c; the position of the groove protrusion in FIG. 23d is the same as the position of the solid groove protrusion in FIG. 22d; with respect to position of the groove protrusions relative to the groove conductive beam in FIGS. 23a-23d, it may be referred to position of the solid protrusions relative to the solid conductive beam in FIGS. 22a-22d and details will not repeatedly described herein again.

In addition, in the present embodiment, the conductive trenches may also be fully filled with conductive metal to form a shape of the conductive pillar.

Figure 16:
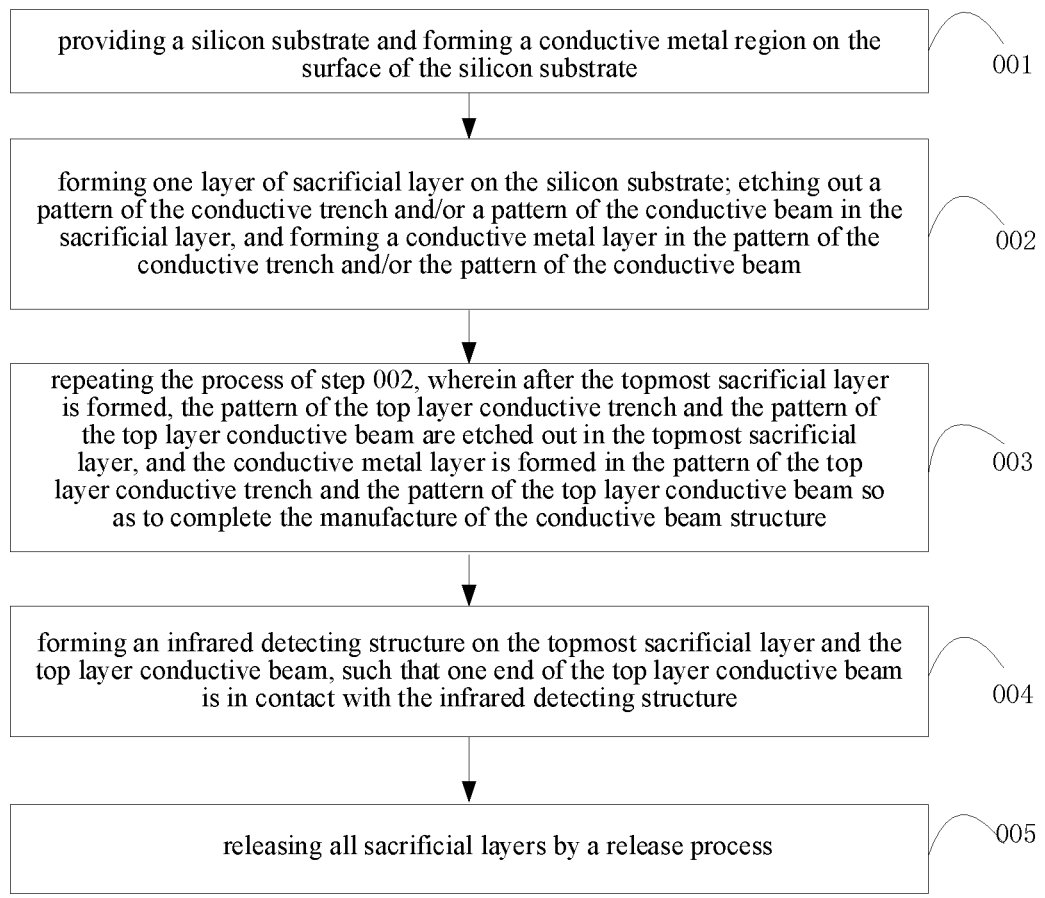
FIG. 16 is a schematic flow chart of a manufacturing method of an infrared detector pixel structure according to Embodiment 3 of the present invention
Figure 17:
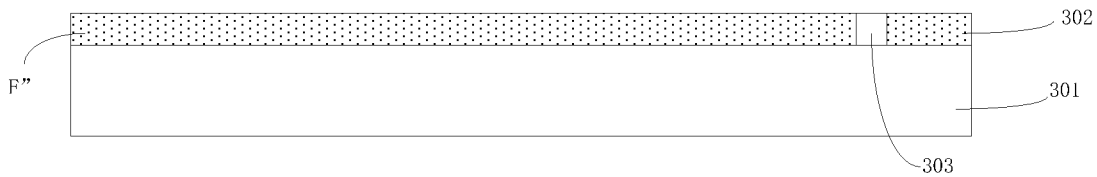
FIGS. 17-21 are schematic diagrams of respective manufacturing steps of a manufacturing method of an infrared detector pixel structure according to Embodiment 3 of the present invention

Referring to FIG. 16, in the present embodiment, a method for manufacturing the above infrared detector pixel structure comprises of:

Step 001: referring to FIG. 17, providing a silicon substrate 301 and forming a conductive metal region 302 on the surface of the silicon substrate 301; herein, there is an interconnection layer in the silicon substrate 301 and the conductive metal region 302 and the interconnection layer are electrically connected each other; the surface of the silicon substrate 301 further has a reflective region F''' and a dielectric region located between the conductive metal region 302 and the reflective region F'''; the interconnection layer is connected to an external circuit.

Step 002: forming one layer of sacrificial layer on the silicon substrate; etching out a pattern of the conductive trench and/or a pattern of the conductive beam in the sacrificial layer and forming a conductive metal layer in the pattern of the conductive trench and/or the pattern of the conductive beam to form the conductive trench or the conductive beam of the layer.

Figure 18:
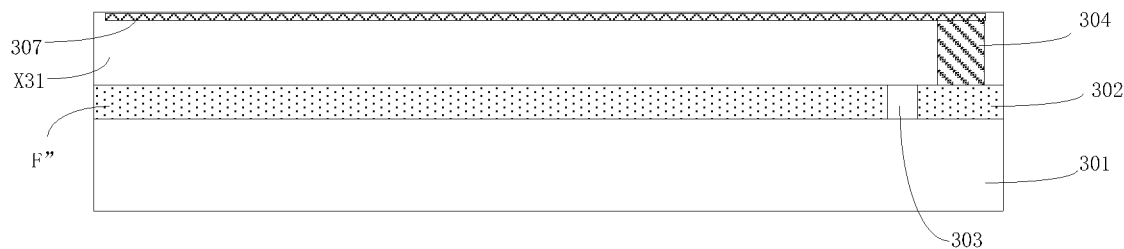

Specifically, referring to FIG. 18, herein, first sacrificial layer X31 is formed on the silicon substrate 301, and a pattern of the first layer conductive trench 304 and a pattern of the first layer conductive beam 307 are etched out in the first sacrificial layer X31, and a conductive metal layer is formed therein to form the first layer conductive trench 304 and the first layer conductive beam 307; herein, it is further comprised of: after depositing the conductive metal layer, planarizing the conductive metal layer to remove the conductive metal layer which is higher than the surface of the first sacrificial layer X31.

The process of forming the conductive metal layer specifically includes that: a lower release protection layer, a conductive metal layer, and an upper release protection layer are sequentially formed in the pattern of the first layer conductive trench 304 and the pattern of the first layer conductive beam 307, and the formed structure is shown as FIG. 8a; or a conductive metal layer and an upper release protection layer are sequentially formed in the pattern of the first layer conductive trench 304 and the pattern of the first layer conductive beam 307, and the formed structure is shown as FIG. 8b; or only a conductive metal layer is formed in the pattern of the first layer conductive trench 304 and the pattern of the first layer conductive beam 307; there may be gaps between the conductive metal layers located at sidewall of the first layer conductive trench 304, and the formed structure is shown as FIG. 8c; if the pattern of the first layer conductive trench 304 and the pattern of the first layer conductive beam 307 are fully filled with the conductive metal layer, the first layer conductive trench 304 is a shape of a conductive pillar. In addition, in this embodiment, since the bottom portion of the first layer conductive beam 307 has protrusions, pattern of these protrusions is formed in the first sacrificial layer X31 below the pattern corresponding to the first layer conductive beam 307 before the pattern of the first layer conductive beam 307 is formed; for the description of the protrusion pattern, it may be referred to the above description of protrusions, and it will not be repeatedly described herein again. Then, the formed lower release protection layer, the conductive metal layer and the upper release protection layer, or the conductive metal layer and the upper release protection layer, or the conductive metal layer are also simultaneously located in the protrusion pattern, thereby forming the protrusions located at the bottom portion of the first layer conductive beam 307.

Step 003: repeating the process of step 002, wherein after the topmost sacrificial layer is formed, the pattern of the top layer conductive trench and the pattern of the top layer conductive beam are etched out in the topmost sacrificial layer, and the conductive metal layer is formed in the pattern of the top layer conductive trench and the pattern of the top layer conductive beam so as to complete the manufacture of the conductive beam unit.

Figure 19:
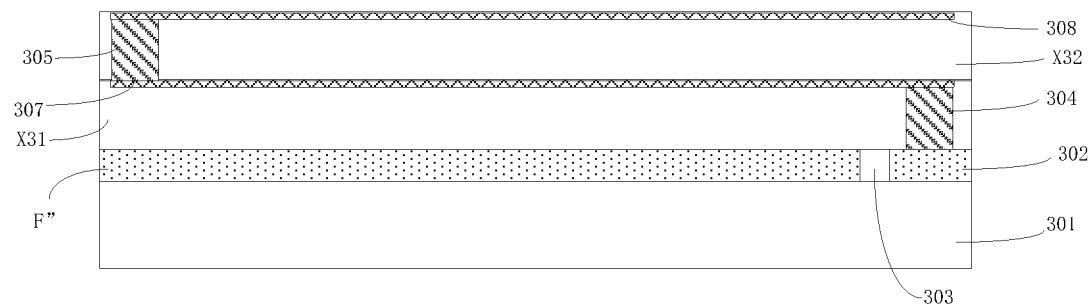

Specifically, referring to FIG. 19, herein, a second sacrificial layer X32 is formed on the silicon substrate 301 which has been subjected to the step 002, a pattern of the second layer conductive trench 305 and a pattern of the second layer conductive beam 308 are etched out in the second sacrificial layer X32, and a conductive metal layer is formed therein to form the second layer conductive trench 305 and the second layer conductive beam 308; herein it is further comprised of, after forming the conductive metal layer, planarizing the conductive metal layer to remove the conductive metal layer which is higher than the surface of the second sacrificial layer X32.

The process of forming the conductive metal layer specifically includes that: a lower release protection layer, a conductive metal layer, and an upper release protection layer are sequentially formed in the pattern of the second layer conductive trench 305 and the pattern of the second layer conductive beam 308, and the formed structure is shown as FIG. 8a; or a conductive metal layer and an upper release protection layer are sequentially formed in the pattern of the second layer conductive trench 305 and the pattern of the second layer conductive beam 308, and the formed structure is shown as FIG. 8b; or only a conductive metal layer is formed in the pattern of the second layer conductive trench 305 and the pattern of the second layer conductive beam 308; there may be gaps between the conductive metal layers located at sidewall of the second layer conductive trench 305, and the formed structure is shown as FIG. 8c; if the pattern of the second layer conductive trench 305 is fully filled with the conductive metal layer, it is a shape of a conductive pillar. In addition, in this embodiment, since the bottom portion of the second layer conductive beam 308 has protrusions, pattern of these protrusions is formed in the second sacrificial layer X32 below the pattern corresponding to the second layer conductive beam 308 before the pattern of the second layer conductive beam 308 is formed; for the description of the protrusion pattern, it may be referred to the above description of protrusions, and it will not be repeatedly described herein again. Then, the formed lower release protection layer, the conductive metal layer and the upper release protection layer, or the conductive metal layer and the upper release protection layer, or the conductive metal layer are also simultaneously located in the protrusion pattern, thereby forming the protrusions located at the second layer conductive beam 308.

It should be noted, in the present embodiment, since each of the conductive metal layer and/or the upper release protection layer and/or the lower release protection layer is simultaneously deposited in the pattern of the first layer conductive trench 304, the pattern of the first layer conductive beam unit 307 and the pattern of the protrusions at its bottom portion, or simultaneously deposited in the pattern of the second layer conductive trench 305, the pattern of the second layer conductive beam 308 and the pattern of the protrusions at its bottom portion, it is possible to fully fill these patterns to form a solid, and it is also possible not to fully fill these patterns to form a groove, and thus the structure of combination of the first layer conductive beam 307 and protrusion at its bottom portion and the first layer conductive trench 304 includes any combination of a solid or groove first layer conductive beam 307, solid or groove protrusions at the bottom portion of the first layer conductive beam 307, and a solid or groove first layer conductive trench 304, and the structure of combination of the second layer conductive beam 308 and protrusions at its bottom portion and the second layer conductive trench 305 includes any combination of a solid or groove second layer conductive beam 308, solid or groove protrusions at the bottom portion of the second layer conductive beam 308, and a solid or groove second layer conductive trench 305, which are all within the scope of the present invention.

Step 004: forming an infrared detecting element on the topmost sacrificial layer and the top layer conductive beam, such that one end of the top layer conductive beam is in contact with the infrared detecting element.

Figure 20:
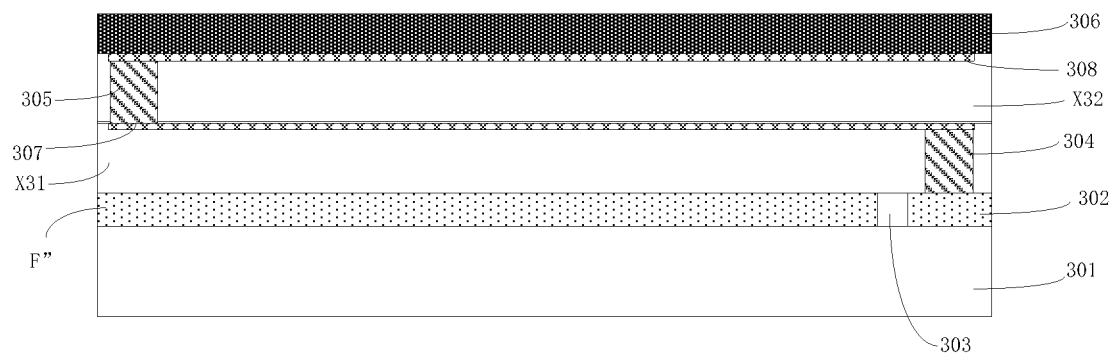

Specifically, referring to FIG. 20, a micro-bridge structure 306 is formed on the second sacrificial layer X32 and the second layer conductive beam 308, such that the microbridge structure 306 is in contact with the second layer conductive beam 308.

Figure 21:
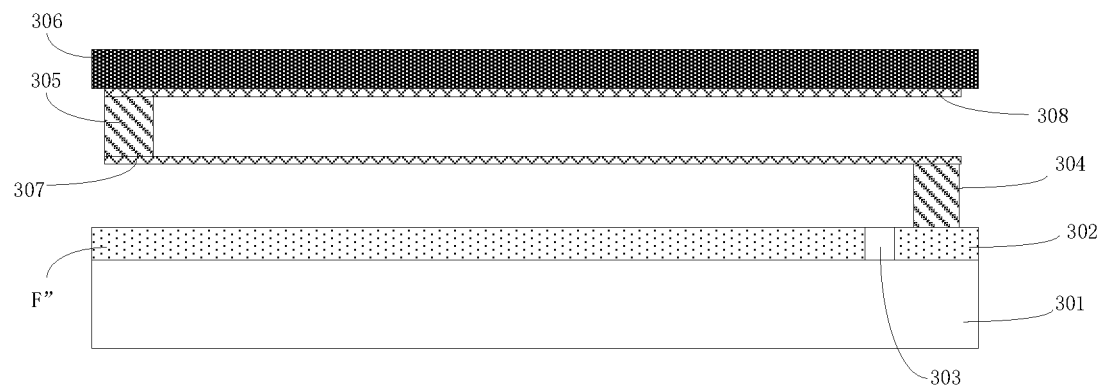

Step 005: referring to FIG. 21, releasing all the sacrificial layers by a release process.

Specifically, the release process can set appropriate process parameters according to material of the sacrificial layers, and details thereof will not be described herein again.

Although the present invention has been described in the above preferred embodiments, the purpose of the embodiments is only to illustrate for the convenience of the description and is not intended to limit the present invention, and those skilled in the art can make some variations and modifications without departing from the spirit and scope of the present invention. The scope of protection claimed by the present invention is determined by the scope of the claims.

The invention claimed is:

1. An infrared detector pixel structure, which is located on a silicon substrate, comprising a conductive metal region on surface of the silicon substrate; an infrared detecting element located above the silicon substrate for detecting infrared light and generating electrical signal; and a conductive beam unit electrically connected to the infrared detecting element for transmitting the electrical signal generated by the infrared detecting element to the conductive metal region; wherein the conductive beam unit includes at least one conductive beam layer multiple conductive trenches, and optionally an infrared-connected conductive beam layer, the conductive trenches are arranged in a vertical direction; wherein two ends of each conductive beam layer are respectively connected to two conductive trenches, wherein bottom portions of the conductive trenches are not in the same horizontal plane;

when the conductive beam unit includes the infrared-connected conductive beam layer, the infrared detecting element is in contact with the infrared-connected conducive beam layer, and only one end of the infrared-connected conductive beam layer is connected to one of the conductive trenches, when the conductive beam unit does not include the infrared-connected conductive beam layer the infrared detecting elements is in contact with one of the conductive trenches;

the conductive metal region is in contact with a bottom portion of another one of the conductive trenches;

the electrical signal generated by the infrared detecting element is transmitted along the conductive trenches and the at least one conductive beam layer, and optionally along the infrared-connected conductive beam layer to be transmitted downward to the conductive metal region in a circuitous path in the vertical direction.

2. The infrared detector pixel structure according to claim 1, wherein, the conductive beam unit includes one conductive beam layer and two conductive; the two conductive trenches include a first conductive trench of which a bottom portion is in contact with the conductive metal region and a top portion is located at the conductive beam layer and a second conductive trench of which a bottom portion is higher than that of the first conductive trench and a top portion is located at the conductive beam layer; the top portion of the first conductive trench and the top portion of the second conductive trench are respectively connected to two ends of the conductive beam layer; the bottom portion of the second conductive trench is connected to the infrared detecting element; the electrical signal generated by the infrared detecting element is firstly transmitted to the top portion of the second conductive trench via the bottom portion of the second conductive trench, next transmitted to the top portion of the first conductive trench via the conductive beam layer, then transmitted to the bottom portion of the first conductive trench from the top portion of the first conductive trench and thus transmitted to the conductive metal region; and further transmitted to an interconnection layer via the conductive metal region.

3. The infrared detector pixel structure according to claim 1, wherein, each conductive beam layer has a first end connected to a bottom portion of one of the conductive trenches and a second end connected to a top portion of another one of the conductive trenches the conductive trenches comprise a top conductive trench, a top portion of the top conductive trench is connected to the infrared detecting element such that the infrared detecting element is located above the conductive beam unit, and each pair of one of the conductive trenches and one of the at least one conductive beam layer constitute a structure with a circuitous stepwise shape such that a transmission path of the electrical signal generated by the infrared detecting element is a circuitous stepwise shape; the electrical signal generated by the infrared detecting element is transmitted from the top portion of the top conductive trench to a bottom portion of the top conductive trench, then transmitted to the top portion of a next conductive trench via the conductive beam layer, and finally transmitted to the conductive metal region.

4. The infrared detector pixel structure according to claim 1, wherein, the conductive beam unit includes the infrared-connected conductive beam layer; each conductive beam layer has a first end connected to a bottom portion of one of the conductive trenches and a second end connected to a top portion of another one of the conductive trenches; wherein the conductive trenches include a top conductive trench and a bottom conductive trench; a bottom portion of the bottom conductive trench is in contact with the conductive metal region; a top portion of the top conductive trench is in contact with the infrared-connected conductive beam layer, the infrared-connected conductive beam layer is connected to the infrared detecting element such that a micro-bridge structure is located above the conductive beam unit, and each pair of one of the conductive trenches and one of the at least one conductive beam layer constitute a structure with a circuitous stepwise shape such that a transmission path of electrical signal generated by the micro-bridge structure is a circuitous stepwise shape; the electrical signal generated by the infrared detecting element is transmitted from the infrared-connected conductive beam layer to a top portion of the top conductive trench, then transmitted to a bottom portion of the top conductive trench, and finally transmitted to the conductive metal region.

5. The infrared detector pixel structure according to claim 1, wherein, the conductive beam layer is constituted by a first conductive layer and a first upper release protection layer and a first lower release protection layer surrounding the first conductive layer; each of the conductive trenches is constituted by a second upper release protection layer, a second lower release protection layer, and a second conductive layer between the second upper release protection layer and the second lower release protection layer.

6. The infrared detector pixel structure according to claim 1, wherein, the conductive beam layer is constituted by a first conductive layer and a first release protection layer on an upper surface of the first conductive layer; each of the conductive trenches is constituted by a second conductive layer and a second upper release protection layer on the second conductive layer.

7. The infrared detector pixel structure according to claim 1, wherein, the conductive beam layer is constituted by a first conductive layer;
each of the conductive trenches is constituted by a second conductive layer.

8. The infrared detector pixel structure according to claim 7, wherein, each of the conductive trenches is fully filled with the second conductive layer.

9. The infrared detector pixel structure according to claim 1, wherein, a bottom portion of the conductive beam layer has protrusions.

10. The infrared detector pixel structure according to claim 9, wherein, the protrusions are located at non-center positions of the conductive beam layer.

11. The infrared detector pixel structure according to claim 9, wherein, the protrusions are located at equipartitions of the conductive beam layer.

12. The infrared detector pixel structure according to claim 9, wherein, the protrusions and the conductive beam layer both are groove.

13. The infrared detector pixel structure according to claim 9, wherein, the protrusions are reverse hemisphere or reverse cone.

14. The infrared detector pixel structure according to claim 1, wherein, the surface of the silicon substrate further has a reflective region which is located below the infrared detecting element, and there is a dielectric layer between the reflective region and the conductive metal region; an interconnection layer is connected to an external circuit.

15. A method of manufacturing the infrared detector pixel structure according to claim 1, wherein,
Step 01: providing the silicon substrate and forming the conductive metal region on the surface of the silicon substrate;
Step 02: forming the conductive beam unit at first and then forming the infrared detecting element above the silicon substrate, or forming the infrared detecting element at first and then forming the conductive beam unit above the silicon substrate, wherein the infrared detecting element is in contact with one of the conductive trenches of the conductive beam unit or the infrared detecting element is in contact with the infrared-connected conductive beam layer, and a bottom portion of another one of the conductive trenches of the conductive beam unit is in contact with the conductive metal region.

16. The method according to claim 15, wherein, a topmost layer of the conductive beam unit has only a top conductive trench; the Step 02 specifically comprises of: forming a sacrificial layer on the silicon substrate; etching out a pattern of one of the conductive trenches and/or a pattern of the conductive beam layer in the sacrificial layer, and forming a conductive layer in the pattern of the one of the conductive trenches and/or the pattern of the conductive beam layer to form the one of the conductive trenches and/or the conductive beam layer; repeating the above process so as to complete the manufacture of the conductive beam unit; wherein after the sacrificial layer at the topmost layer is formed, the pattern of the top conductive trench is etched out in the sacrificial layer at the topmost layer and the conductive layer is formed in the pattern of the top conductive trench to form the top conductive trench, so as to complete the manufacture of the conductive beam unit; then forming the infrared detecting element on the sacrificial layer at the topmost layer and the top conductive trench such that the infrared detecting element is in contact with the top conductive trench; finally, releasing the sacrificial layer by a release process.

17. The method according to claim 15, wherein, a topmost layer of the conductive beam unit includes a top conductive trench and the top conductive beam layer; the step 02 specifically comprises of: forming a sacrificial layer on the silicon substrate; etching out a pattern of one of the conductive trenches and/or a pattern of the conductive beam layer in the sacrificial layer, and forming a conductive layer in the pattern of the one of the conductive trenches and/or the pattern of the conductive beam layer to form the one of the conductive trenches or the conductive beam layer; repeating the above process, wherein after a topmost sacrificial layer is formed, the pattern of the top conductive trench and the pattern of the top conductive beam layer are etched out in the topmost sacrificial layer and the conductive layer is formed in the pattern of the top conductive trench and the pattern of the top conductive beam layer so as to form the top conductive trench and the top conductive beam layer, and thus to complete the manufacture of the conductive beam unit; then forming the infrared detecting element on the topmost sacrificial layer and the top conductive beam layer such that one end of the top conductive beam layer is in contact with the infrared detecting element; finally, releasing the sacrificial layer by a release process.

18. The method according to claim 15, wherein,
the conductive beam unit includes one conductive beam layer; the conductive trenches includes a first conductive trench of which a bottom portion in contact with the conductive metal region and a top portion located at the conductive beam layer and a second conductive trench of which a bottom portion is higher than that of the first conductive trench and a top portion is located at the conductive beam layer; the Step 02 specifically comprises of: firstly forming a first sacrificial layer on the silicon substrate; etching out a pattern of a lower portion of the first conductive trench in the first sacrificial layer, and forming a conductive layer in the pattern of the lower portion of the first conductive trench so as to form the lower portion of the first conductive trench; then forming the infrared detecting element on the first sacrificial layer, the infrared detecting element being not in contact with the lower portion of the first conductive trench; secondly forming a second sacrificial layer on the silicon substrate which has been subjected to the Step 03, etching out a pattern of the second conductive trench, a pattern of the conductive beam layer and a pattern of a remaining upper portion of the first conductive trench in the second sacrificial layer, and forming another conductive layer in the pattern of the second conductive trench, the pattern of the conductive beam layer and the pattern of the remaining upper portion of the first conductive trench so as to form the complete the first conductive trench, the second conductive trench and the conductive beam layer; finally releasing the sacrificial layer by a release process.

19. The method according to claim 15, wherein, in the step 02, the process of forming the conductive beam layer specifically comprises of:
sequentially forming a lower release protection layer, a conductive layer and an upper release protection layer in a pattern of one of the conductive trenches and/or a pattern of the conductive beam layer; or sequentially forming a conductive layer and a release protection layer in the pattern of one of the conductive trenches and/or the pattern of the conductive beam layer; or only forming a conductive layer in the pattern of one of the conductive trenches and/or the pattern of the conductive beam layer.

20. The method according to claim 19, wherein, when only the conductive layer of one of the conductive trenches is deposited in the pattern of the one of the conductive trenches, the pattern of the one of the conductive trenches is fully filled with the conductive layer of the one of the conductive trenches, or there are gaps between the conductive layers of the one of the conductive trenches at sidewalls of the one of the conductive trenches.

\* \* \* \* \*